(12) United States Patent
Zundel et al.

(10) Patent No.: US 10,217,830 B2
(45) Date of Patent: Feb. 26, 2019

(54) SEMICONDUCTOR DEVICE HAVING TRENCHES WITH ENLARGED WIDTH REGIONS

(71) Applicant: Infineon Technologies AG, Neubiberg (DE)

(72) Inventors: Markus Zundel, Egmating (DE); Thomas Ostermann, Velden am Wörthersee (AT); Michael Sorger, Villach (AT)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 15/373,128

(22) Filed: Dec. 8, 2016

(65) Prior Publication Data

US 2017/0170286 A1    Jun. 15, 2017

(30) Foreign Application Priority Data

Dec. 10, 2015  (DE) .......................... 10 2015 121 563

(51) Int. Cl.
*H01L 29/417* (2006.01)
*H01L 29/06* (2006.01)
(Continued)

(52) U.S. Cl.
CPC .... *H01L 29/41775* (2013.01); *H01L 29/0696* (2013.01); *H01L 29/1083* (2013.01);
(Continued)

(58) Field of Classification Search
CPC ............. H01L 29/0696; H01L 29/7813; H01L 29/407; H01L 29/41766; H01L 29/4238;
(Continued)

(56) References Cited

U.S. PATENT DOCUMENTS 5,258,634 A * 11/1993 Yang ................. H01L 21/28273
257/316
5,563,439 A   10/1996 Chung et al.
(Continued)

FOREIGN PATENT DOCUMENTS

DE    42 43 610 A1   7/1993
DE    197 11 165 A1  9/1998
(Continued)

*Primary Examiner* — Khiem D Nguyen
(74) *Attorney, Agent, or Firm* — Design IP

(57) ABSTRACT

A semiconductor device includes a plurality of trenches extending into a semiconductor substrate. Each trench comprises a plurality of enlarged width regions distributed along the trench. At least one electrically conductive trench structure is located in each trench. The semiconductor device comprises an electrically insulating layer arranged between the semiconductor substrate and an electrode structure. The semiconductor device comprises a vertical electrically conductive structure extending through the electrically insulating layer. The vertical electrically conductive structure forms an electrically connection between the electrode structure and an electrically conductive trench structure located in a first trench of at a first enlarged width region. The electrically insulating layer is arranged between a second enlarged width region of the plurality of enlarged width regions of the first trench and an electrode structure above the second enlarged width region without any vertical electrical connections through the electrically insulating layer at the second enlarged width region.

19 Claims, 14 Drawing Sheets

(51) Int. Cl.
  *H01L 29/10* (2006.01)
  *H01L 29/40* (2006.01)
  *H01L 29/423* (2006.01)
  *H01L 29/739* (2006.01)
  *H01L 29/78* (2006.01)

(52) U.S. Cl.
  CPC .......... *H01L 29/401* (2013.01); *H01L 29/407* (2013.01); *H01L 29/41741* (2013.01); *H01L 29/41766* (2013.01); *H01L 29/4236* (2013.01); *H01L 29/4238* (2013.01); *H01L 29/7813* (2013.01); *H01L 29/7397* (2013.01); *H01L 29/7827* (2013.01)

(58) Field of Classification Search
  CPC ............. H01L 29/7397; H01L 29/7827; H01L 29/41775; H01L 29/4236; H01L 28/7813; H01L 28/407; H01L 28/4236
  See application file for complete search history.

(56) References Cited

U.S. PATENT DOCUMENTS

| | | | | |
|---|---|---|---|---|
| 6,060,747 | A * | 5/2000 | Okumura | H01L 29/0696 257/331 |
| 6,406,962 | B1 | 6/2002 | Agnello et al. | |
| 7,598,566 | B2 | 10/2009 | Ilotta et al. | |
| 7,605,427 | B2 | 10/2009 | Hirler | |
| 7,875,544 | B2 * | 1/2011 | Wong | G06F 17/5068 257/774 |
| 8,093,655 | B2 | 1/2012 | Hirler et al. | |
| 8,659,065 | B2 * | 2/2014 | Sumitomo | H01L 29/0619 257/139 |
| 2005/0167742 | A1 * | 8/2005 | Challa | H01L 21/3065 257/328 |
| 2006/0017056 | A1 * | 1/2006 | Hirler | H01L 29/7813 257/77 |
| 2006/0040428 | A1 * | 2/2006 | Johnson | H01L 21/4857 438/121 |
| 2006/0246650 | A1 * | 11/2006 | Williams | H01L 29/7827 438/212 |
| 2007/0040213 | A1 * | 2/2007 | Hotta | H01L 29/0696 257/330 |
| 2007/0059887 | A1 * | 3/2007 | Poelzl | H01L 29/407 438/270 |
| 2009/0096018 | A1 * | 4/2009 | Izumi | H01L 29/0696 257/328 |
| 2009/0218618 | A1 * | 9/2009 | Blank | H01L 29/407 257/331 |
| 2010/0052044 | A1 | 3/2010 | Hirler | |
| 2011/0037120 | A1 | 2/2011 | Chen et al. | |
| 2011/0312138 | A1 * | 12/2011 | Yedinak | H01L 21/3065 438/270 |
| 2013/0153999 | A1 * | 6/2013 | Zhang | H01L 29/7813 257/334 |
| 2014/0209905 | A1 * | 7/2014 | Meiser | H01L 23/544 257/48 |
| 2015/0325687 | A1 * | 11/2015 | Baburske | H01L 29/0696 257/139 |
| 2016/0190123 | A1 * | 6/2016 | Laven | H01L 29/42368 257/140 |

FOREIGN PATENT DOCUMENTS

| | | |
|---|---|---|
| DE | 20 2004 021 352 U1 | 9/2007 |
| DE | 10 2009 035 688 A1 | 4/2010 |
| DE | 10 2006 026 943 B4 | 1/2011 |
| DE | 10 2011 081 462 A1 | 3/2012 |
| WO | 2005 065385 A2 | 7/2005 |

* cited by examiner

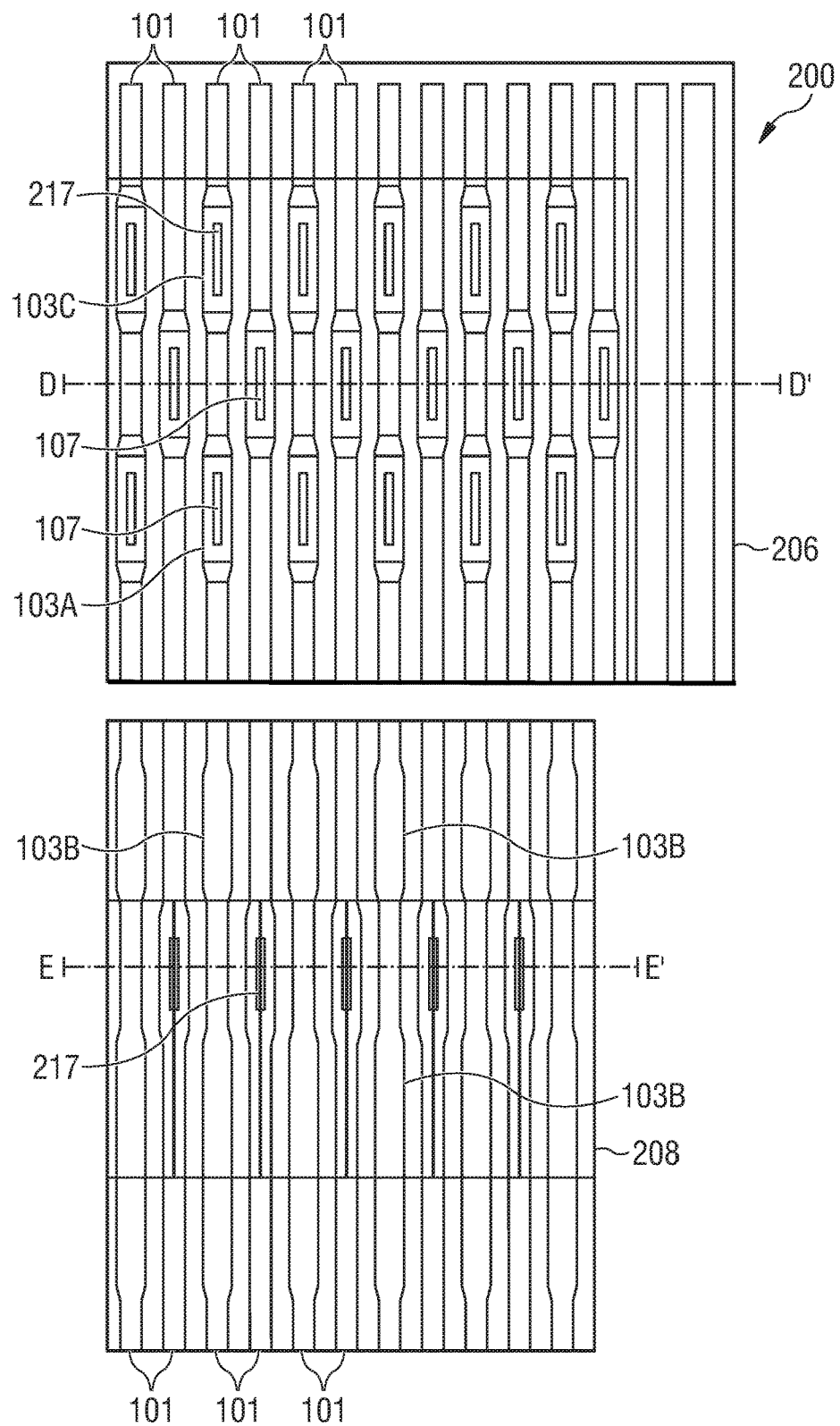

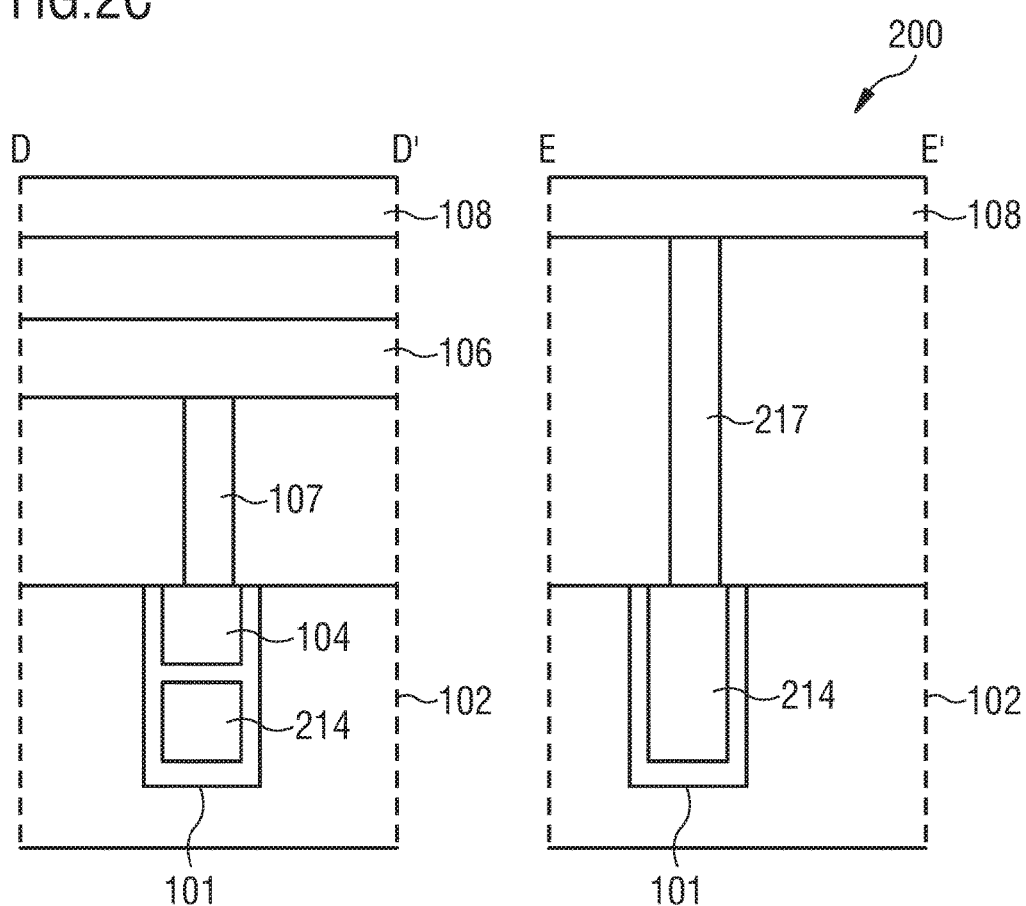

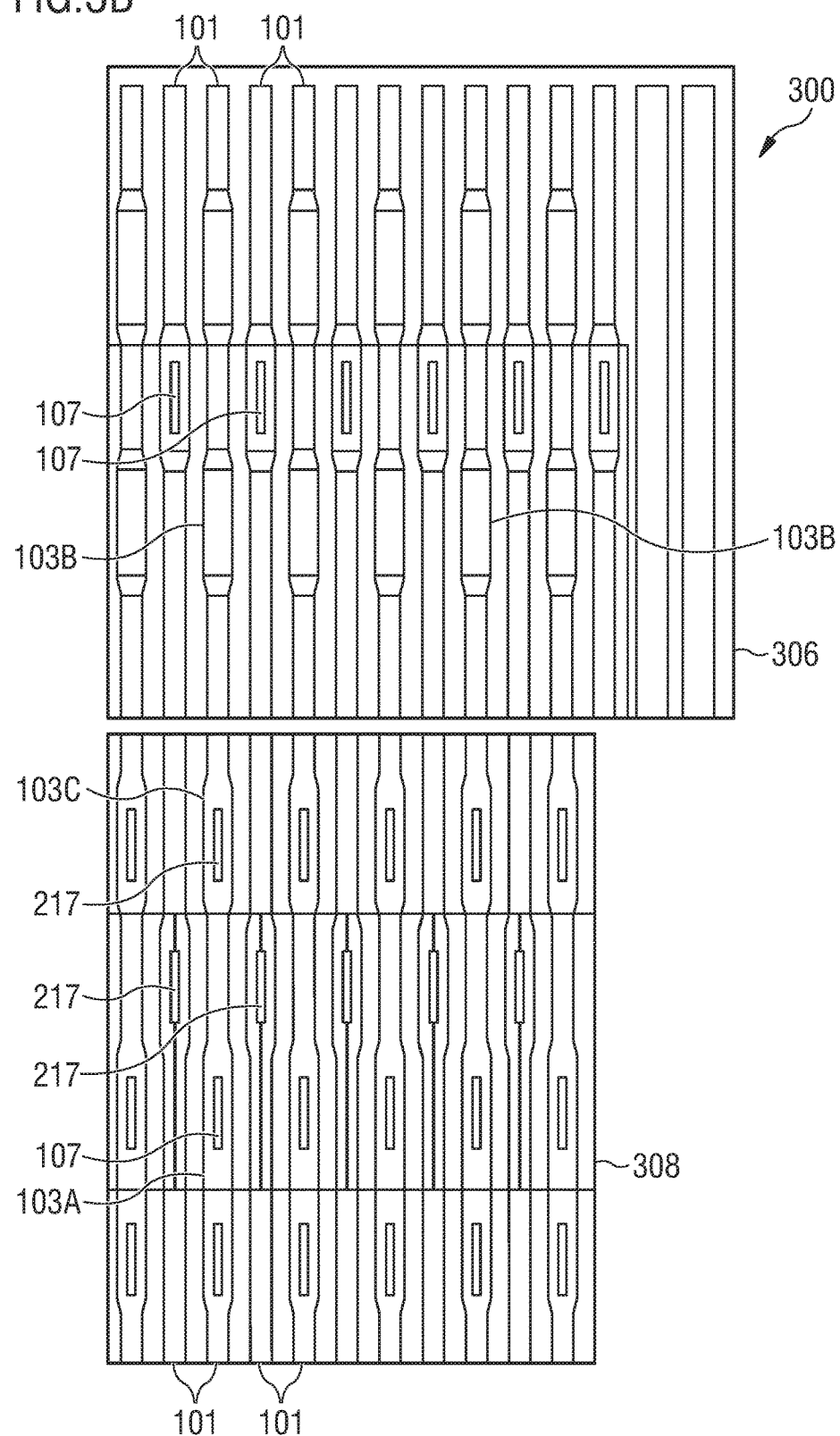

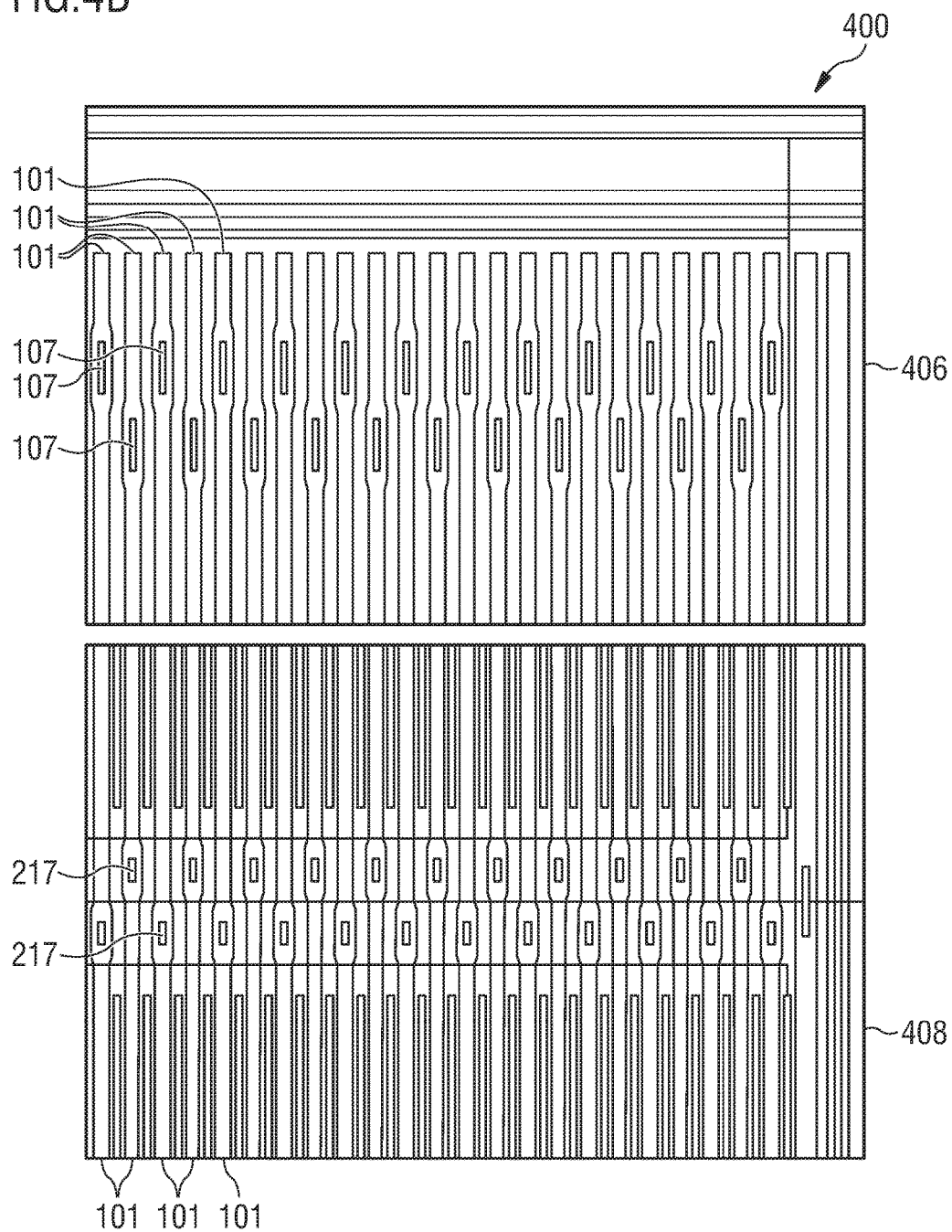

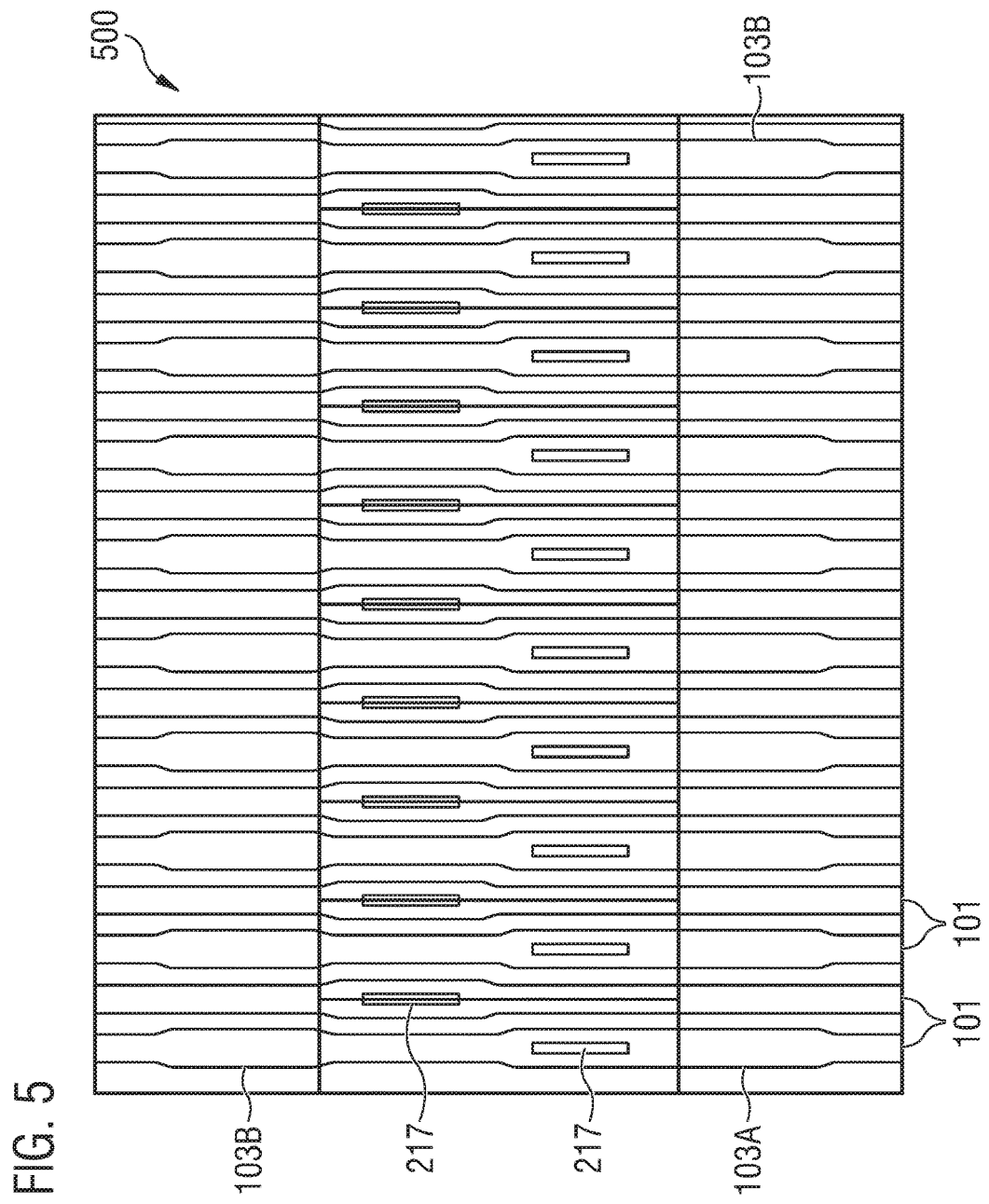

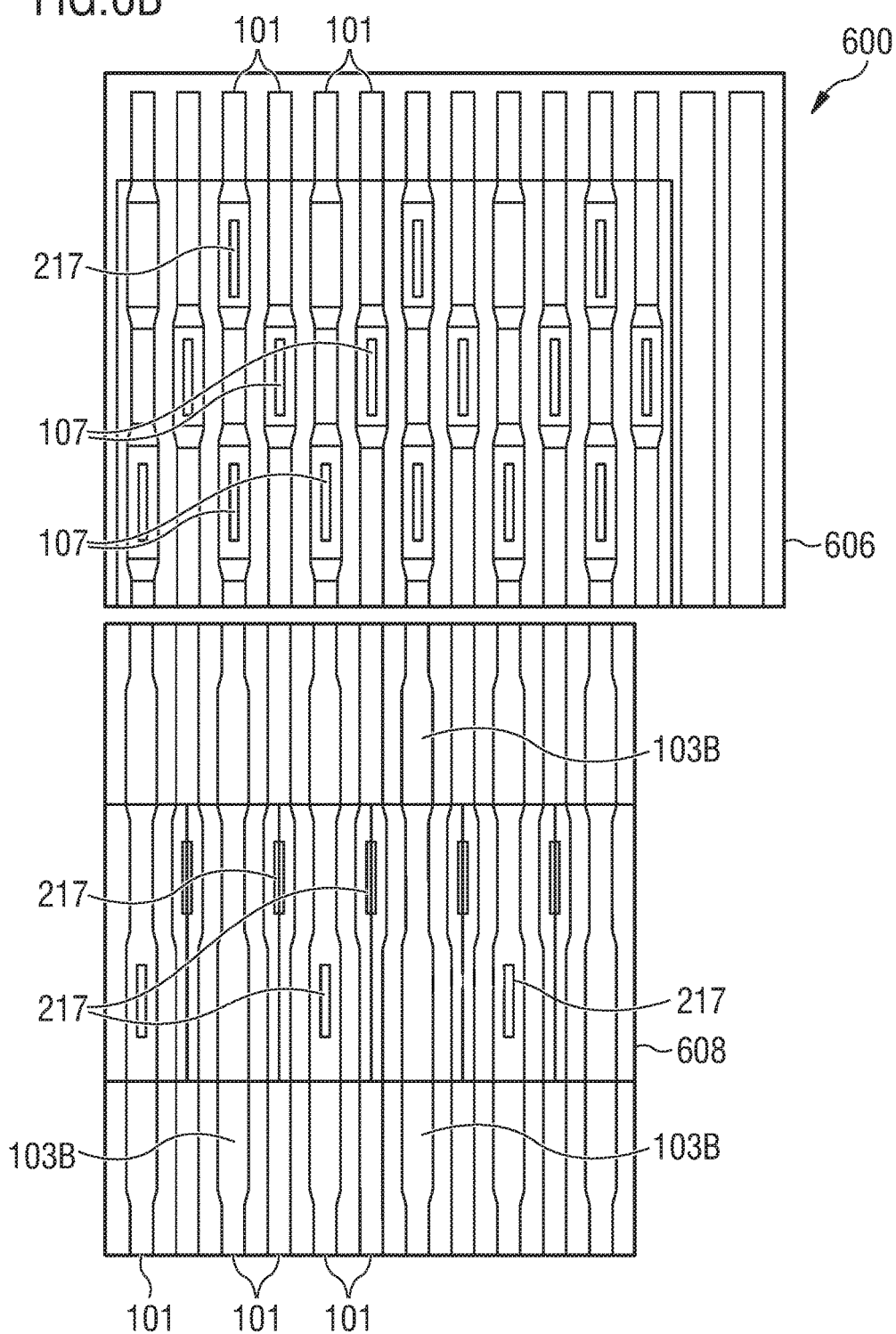

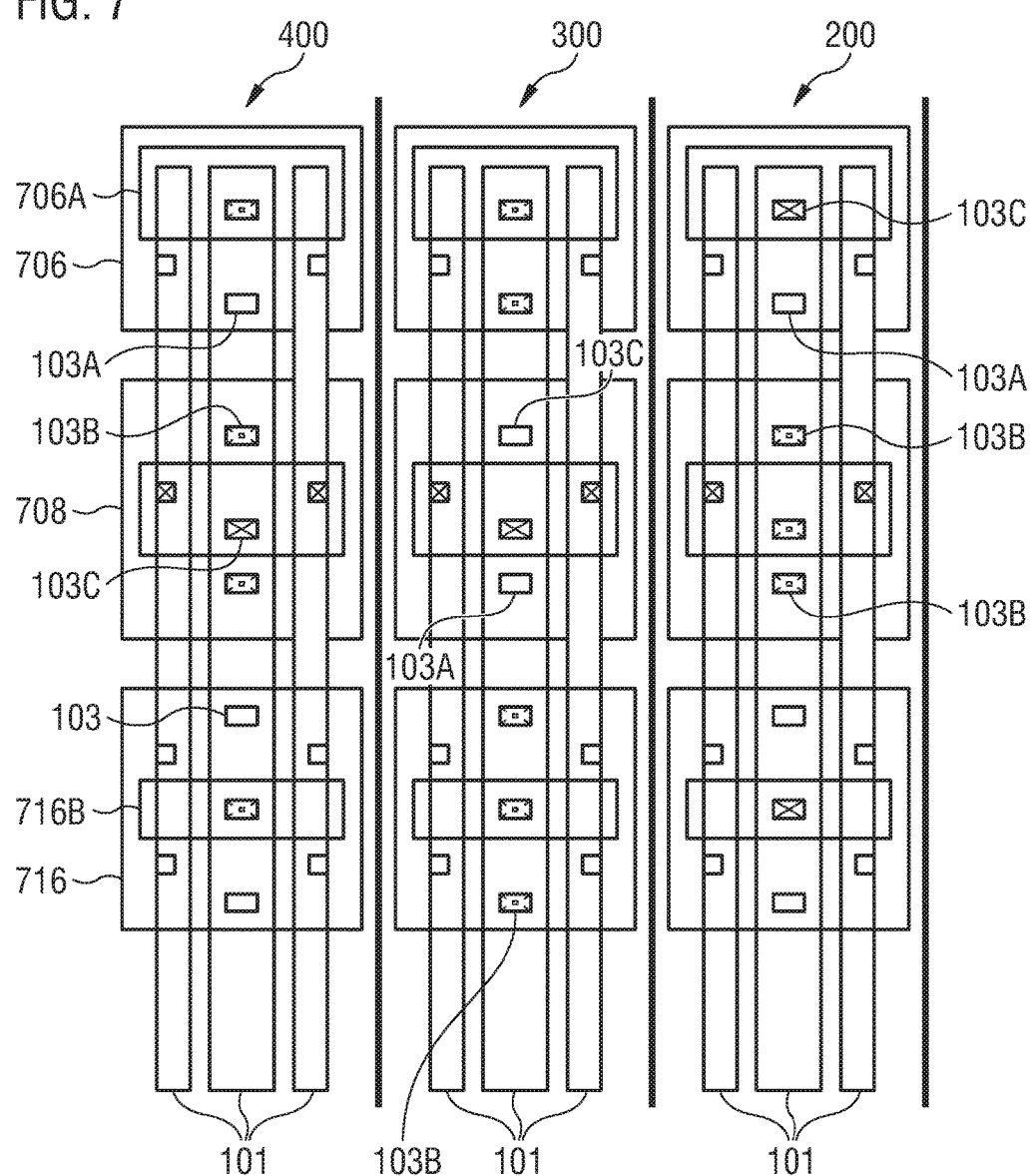

SEMICONDUCTOR DEVICE HAVING TRENCHES WITH ENLARGED WIDTH REGIONS

FIELD OF INVENTION

Embodiments relate to concepts for semiconductor device structures, and in particular to semiconductor devices and a method for forming a semiconductor device.

BACKGROUND

Semiconductor devices (e.g., power transistors) may have specific requirements and may have to be accurately optimized for various applications. For example, transistors may need to be optimized based on turn-on resistance (e.g., Ron*A) or switching speeds. Forming or manufacturing semiconductor devices having different switching speeds or turn-on resistances may be challenging due to the individualization required for the different devices. For example, the designing of complex mask layouts may be prone to error and/or may incur high costs.

SUMMARY

One or more embodiments relate to a semiconductor device. The semiconductor device comprises a plurality of trenches extending into a semiconductor substrate. Each trench of the plurality of trenches comprises a plurality of enlarged width regions distributed along the trench. At least one electrically conductive trench structure is located in each trench of the plurality of trenches. The semiconductor device further comprises an electrically insulating layer arranged between the semiconductor substrate and an electrode structure. The semiconductor device further comprises a vertical electrically conductive structure extending through the electrically insulating layer. The vertical electrically conductive structure forms an electrically connection between the electrode structure and an electrically conductive trench structure located in a first trench of the plurality of trenches at a first enlarged width region of the plurality of enlarged width regions of the first trench of the plurality of trenches. The electrically insulating layer is arranged between a second enlarged width region of the plurality of enlarged width regions of the first trench and an electrode structure above the second enlarged width region without any vertical electrical connections through the electrically insulating layer at the second enlarged width region.

One or more embodiments relate to a method for forming a semiconductor device. The method comprises forming an electrically insulating layer between a semiconductor substrate and an electrode structure. The semiconductor substrate comprises a plurality of trenches extending into the semiconductor substrate. Each trench of the plurality of trenches comprises a plurality of enlarged width regions distributed along the trench. At least one electrically conductive trench structure is located in each trench of the plurality of trenches. The method further comprises forming at least one hole extending through the electrically insulating layer at a first enlarged width region of the plurality of enlarged width regions. The trench remains covered by the electrically insulating layer at a second enlarged width region of the plurality of enlarged width regions during the forming of the at least one hole.

One or more embodiments relate to a further semiconductor device. The semiconductor device comprises a plurality of trenches extending into a semiconductor substrate. Each trench of the plurality of trenches comprises a plurality of enlarged width regions distributed along the trench. A total number of vertical electrically conductive structures connecting electrically conductive trench structures located within the trenches of the plurality of trenches is less than a number of enlarged width regions of the plurality of trenches.

BRIEF DESCRIPTION OF THE DRAWING(S)

Some embodiments of apparatuses and/or methods will be described in the following by way of example only, and with reference to the accompanying figures, in which FIG. 1 shows a top view schematic illustration of a semiconductor device;

FIGS. 2A and 2B show schematic illustrations of a cross-section and a top view of a semiconductor device having a low speed variation;

FIG. 2C shows a schematic illustration of different cross-sections through one trench of the plurality of trenches;

FIGS. 3A and 3B show schematic illustrations of a cross-section and a top view of a semiconductor device having a high speed variation;

FIGS. 4A and 4B show schematic illustrations of a cross-section and a top view of a semiconductor device having a normal speed variation;

FIG. 5 shows a schematic illustration of a semiconductor device having a normal speed variation with inactive contacts;

FIGS. 6A and 6B show schematic illustrations of a cross-section and a top view of a further semiconductor device;

FIG. 7 shows a top view schematic illustration of an overview of semiconductor devices having different speeds;

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

Figure 1:
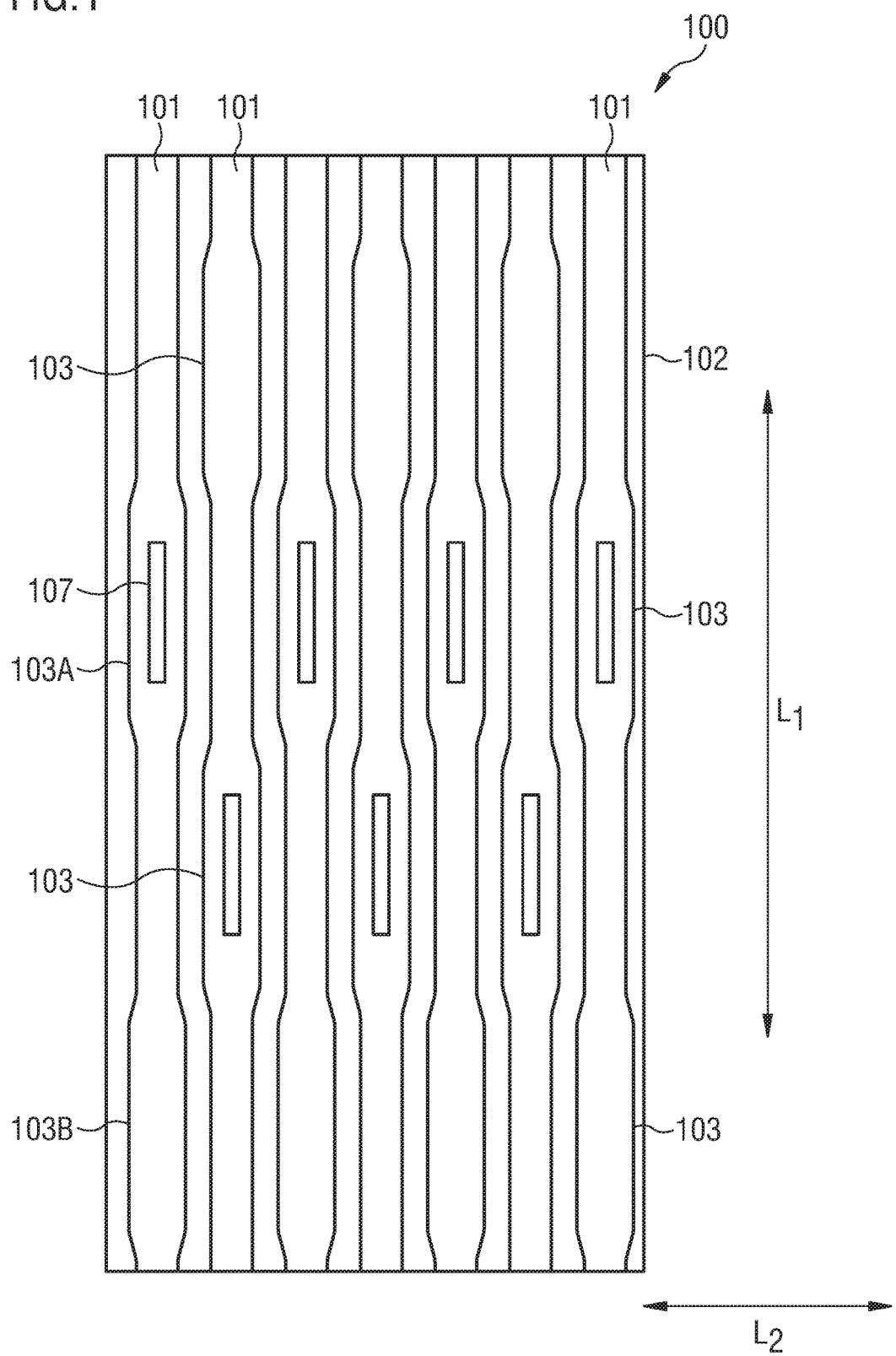

FIG. 1 shows a top view schematic illustration of a semiconductor device 100 according to an embodiment.

The semiconductor device 100 comprises a plurality of trenches 101 extending into a semiconductor substrate 102. Each trench 101 of the plurality of trenches 101 comprises a plurality of enlarged width regions 103 distributed along the trench 101.

At least one electrically conductive trench structure is located in each trench 101 of the plurality of trenches 101.

The semiconductor device 100 further comprises an electrically insulating layer arranged between the semiconductor substrate 102 and an electrode structure.

The semiconductor device 100 further comprises a vertical electrically conductive structure 107 extending through the electrically insulating layer. The vertical electrically conductive structure 107 forms an electrical connection between the electrode structure and an electrically conductive trench structure located in a first trench 101 of the plurality of trenches 101 at a first enlarged width region 103A of the plurality of enlarged width regions 103 of the first trench 101 of the plurality of trenches 101.

The electrically insulating layer is arranged between a second enlarged width region 103B of the plurality of enlarged width regions 103 of the first trench 101 and an electrode structure above the second enlarged width region 103B without any vertical electrical connections through the electrically insulating layer at the second enlarged width region 103B.

Due to the semiconductor device 100 being without any vertical electrical connections through the electrically insulating layer at the second enlarged width region 103B, errors in the semiconductor devices may be reduced. Reduced costs may further be achieved as devices may be contacted to metallization structures through contact holes only if required for the device, for example.

The plurality of trenches 101 are extending into (e.g. located in) the semiconductor substrate 102. For example, the plurality of trenches 101 may extend vertically into the semiconductor substrate from a first (or front) side surface of the semiconductor substrate 102. The plurality of trenches 101 may have a vertical extension (e.g. a vertical depth). For example, the plurality of trenches 101 may be laminar structures or may have the geometry of a wall or plate. The stripe-shaped trenches 101 of the plurality of trenches 101 may be arranged substantially in parallel to each other (e.g. neglecting manufacturing tolerances) in the semiconductor substrate 102.

The plurality of trenches 101 may have a stripe-shape in a top view of the semiconductor device 100. A stripe-shape may be a geometry extending in a first lateral direction, L1, significantly farther than in an orthogonal second lateral direction, L2. For example, each trench 101 of the plurality of trenches 101 may comprise a lateral length (in the first lateral direction, L1) of more than 10× (or more than 50× or more than 100×) a minimum (or smallest) lateral width (in the second lateral direction) of the trench 101 between two neighboring enlarged width regions 103, for example. The lateral length of the trench 101 may be the largest extension along (or parallel to) a surface of the semiconductor substrate 102 and the minimum lateral width of the trench 101 may be a shortest dimension of the trench 101 between two neighboring enlarged width regions 103. All the trenches 101 of the plurality of trenches 101 may have the same lateral length and/or the minimum lateral width. Alternatively, the lateral length and/or the lateral width of the plurality of trenches 101 may differ at least partly from each other. Optionally, all the trenches 101 of the plurality of trenches 101 may have identical geometries and/or lateral dimensions, for example.

The vertical extension of the plurality of trenches 101 may be shorter than the lateral length of each trench of the plurality of trenches 101, for example. For example, the vertical extension of the plurality of trenches 101 from the first (or front) side surface of the semiconductor substrate 102 into the semiconductor substrate 102 may be more than 1 µm (or e.g. more than 5 µm, or e.g. more than 10 µm, or e.g. more than 20 µm).

In a cross-section orthogonal to the lateral length (or the first lateral direction) of the stripe-shaped trenches 101, the stripe-shaped trenches may have a pillar shape, for example. A minimum width of each trench 101 of the plurality of trenches 101 between two (neighboring or successive) enlarged width regions 103 of the same trench 101 may be less than 2 µm (or e.g. less than 1 µm, or e.g. less than 800 nm, or e.g. less than 500 nm), for example. The minimum width may be a minimum dimension of the trench 101 between two (neighboring or successive) enlarged width regions 103 of the same trench 101 measured in the second lateral direction, for example. The minimum width of the trench 101 may be a characteristic minimum dimension (or distance) of more than 50% (or e.g. more than 60%) of a portion of the trench 101 between two (neighboring or successive) enlarged width regions 103, for example.

Each (or every) trench 101 of the plurality of trenches 101 comprises a plurality of enlarged width regions 103. The enlarged width regions 103 may be enlarged lateral width regions of the plurality trenches 101. For example, the enlarged width regions 103 may be regions of the plurality of trenches 101 which may be enlarged (or e.g. larger, or e.g. bigger) in the second lateral direction, for example. For example, each enlarged width region 103 may be a broadening (or widening) of the width of the trench 101 in the second lateral direction, for example.

A maximum (e.g. largest) or average width (in the second lateral direction) of the plurality of enlarged width regions 103 (or each enlarged width region 103) may be at least 5% (or e.g. at least 10%, or e.g. at least 20%, or e.g. at least 25%, or e.g. between 20% and 50%) larger than a minimum (or smallest) lateral width of the plurality of trenches 101 between two (neighboring or successive) enlarged width regions 103 of the same trench 101, for example. The maximum or average width of each enlarged width region 103 may be a characteristic maximum or average dimension (or distance) of more than 50% (or e.g. more than 60%) of the enlarged width region 103, for example. Alternatively or optionally, a maximum or average width of the plurality of enlarged width regions 103 may be at least 5% (or e.g. at least 10%, or e.g. at least 20%, or e.g. at least 25%, or e.g. between 20% and 50%) larger than an average width of the plurality of trenches 101 excluding the enlarged width regions, or between two (neighboring or successive) enlarged width regions 103 of the same trench 101, for example. Alternatively or optionally, an average width of the plurality of enlarged width regions 103 may be a sum of width values measured at a number of different trench depths divided by the number of measurements carried out at the different trench depths. For example, an average width of the plurality of enlarged width regions 103 may be a sum of width values measured at 25% of the trench depth from the bottom of the trench, 50% of the trench depth from the bottom of the trench and 75% of the trench depth from the bottom of the trench, and divided by 3.

The plurality of enlarged width regions 103 may be distributed along the trench 101 (e.g. along the trench 101 in the first lateral direction), for example. For example, an average length (in the first lateral direction) of the plurality of enlarged width regions 103 may be less than 5 µm (or e.g. less than 3 µm, or e.g. less than 1 µm), for example. A separation distance between enlarged width regions 103 along the same trench 101 may be less than 5 µm (or e.g. less than 3 µm, or e.g. less than 1 µm), for example. Optionally, the plurality of enlarged width regions 103 may be distributed uniformly along the trench 101. For example, each enlarged width region 103 along the trench 101 may be separated from a neighboring enlarged width region 103 along the same trench 101 by the same distance. Alternatively, the plurality of enlarged width regions 103 along the trench 101 may be separated from each other by different distances.

Neighboring or successive trenches 101 of the plurality of trenches 101 may be separated laterally from each other by a lateral distance. For example, a mesa region may be located between neighboring or successive trenches 101 of the plurality of trenches 101. An average lateral distance (e.g. in the second lateral direction, L2) between neighboring or successive trenches 101 of the plurality of trenches 101 (or e.g. an average width of the mesa between neighboring or successive trenches) may be less than 2 times (or e.g. less than 1.5 times or e.g. less than 1 time) a minimum or smallest width of the plurality of trenches 101 between two (neighboring or successive) enlarged width regions 103 of the same trench 101. Alternatively, a minimum (smallest) or maximum (largest) lateral distance between neighboring or successive trenches 101 of the plurality of trenches 101 may be less than 1.5 times (or e.g. less than) a minimum (smallest) width of the plurality of trenches 101 between two (neighboring or successive) enlarged width regions 103 of the same trench 101.

The plurality of trenches may comprise (or may refer to, or may be) at least 10% (e.g. 10%, 20%, 30%, 50%, 70%, 80%, 90%, or 100%) of all trenches extending into the semiconductor substrate 102. Alternatively or optionally, the plurality of trenches 101 may comprise (or refer to) all trenches extending into the semiconductor substrate, for example. For example, all the trenches extending into the semiconductor substrate may each comprise a plurality of enlarged width regions 103 distributed along the trench.

At least one electrically conductive trench structure (e.g. one or more, or e.g. a plurality of electrically conductive trench structures) is located in each trench 101 of the plurality of trenches 101. For example, a first electrically conductive trench structure and a second electrically conductive trench structure may be located in (or e.g. within) each trench 101 of the plurality of trenches 101. The second electrically conductive trench structure may be arranged below the first electrically conductive trench structure in the trench 101, for example. For example, the second electrically conductive trench structure may be arranged between the first electrically conductive trench structure in the trench 101 and a bottom of the trench 101. The first electrically conductive trench structure and the second electrically conductive trench structure may extend laterally in (or within) the first lateral direction L1 (or e.g. in a direction substantially parallel to sidewalls of the trench 101), for example.

A material of the first electrically conductive trench structure and the second electrically conductive trench structure may be polysilicon or a metal, for example.

The first electrically conductive trench structure and the second electrically conductive trench structure may be electrically insulated from each other by an electrically insulating material (e.g. a gate oxide, or e.g. silicon oxide) arranged between the first electrically conductive trench structure and the second electrically conductive structure. The electrically insulating material may be formed on the sidewalls of the trench 101 and at a bottom of the trench 101, for example. For example, the electrically insulating material may be formed between the sidewalls of the trench 101 and the first electrically conductive trench structure and the second electrically conductive structure, and between the bottom of the trench 101 and the second electrically conductive structure.

The electrically insulating layer is arranged between the semiconductor substrate 102 and the electrode structure. For example, the electrically insulating layer may be arranged adjacently to (e.g. directly adjacently to, or e.g. directly on) a surface (e.g. the first side surface) of the semiconductor substrate 102. The electrically insulating layer may be an interlayer dielectric material (e.g. silicon nitride, or e.g. silicon dioxide, for example). The electrically insulating layer may have a minimum (or smallest) thickness of between 200 nm and 1 µm (or e.g. between 200 nm and 800 nm), for example. The electrically insulating layer may electrically isolate (or electrically insulate) structures below the electrically insulating layer (e.g. doping regions, trenches 101, and/or the at least one electrically conductive trench structure located in the semiconductor substrate 102) from structures (e.g. electrode or metallization structures) above the electrically insulating layer, for example.

The (or each) vertical electrically conductive structure 107 extends through the electrically insulating layer between the electrode structure and an electrically conductive trench structure located in the first trench 101 of the plurality of trenches 101. For example, the (or each) vertical electrically conductive structure 107 may be located in a contact hole extending (substantially) vertically through the electrically insulating layer between the electrode structure and an electrically conductive trench structure located in the first trench 101 of the plurality of trenches 101. The (or each) vertical electrically conductive structure 107 may be a vertical via structure (e.g. a vertical connection), for example. The (or each) vertical electrically conductive structure 107 may comprise tungsten (or may be a tungsten-based electrically conductive structure). Alternatively or optionally, the vertical electrically conductive structure 107 may comprise (or may be formed from) copper or aluminum.

The vertical electrically conductive structure 107 of the first trench 101 forms an electrically connection between the electrode structure and an electrically conductive trench structure located in the first trench 101 of the plurality of trenches 101. For example, a first vertical electrically conductive structure 107 of the first trench 101 may be electrically connected to the first electrically conductive trench structure located in the first trench 101 of the plurality of trenches 101. The first vertical electrically conductive structure 107 of the first trench 101 may be electrically connected to the first electrically conductive trench structure at a first enlarged width region 103A of the plurality of enlarged width regions 103 of the first trench 101. For example, a direct electrical connection between the first vertical electrically conductive structure 107 of the first trench 101 and the first electrically conductive trench structure may be located in the first enlarged width region 103A of the plurality of enlarged width regions 103 of the first trench 101.

The electrically insulating layer may be arranged on the front side surface of the semiconductor substrate 102. For example, the electrically insulating layer may cover a majority of the front side surface of the semiconductor substrate. The electrically insulating layer is arranged on the second enlarged width region 103B. For example, the electrically insulating layer may cover (e.g. fully cover) or encapsulate (e.g. fully encapsulate) the second enlarged width region 103B. Since, the electrically insulating layer is arranged between the second enlarged width region 103B of the first trench 101 and any electrode structures (e.g. a first electrode structure and/or a second electrode structure) above the second enlarged width region 103B, the electrically insulating layer may electrically insulate (or isolate) the at least one electrically conductive trench structure (e.g. the first electrically conductive trench structure and the second electrically conductive trench structure) from any electrode structures outside the trench 101 at the second enlarged width region.

The at least one second enlarged width regions 103B may be inactive or free contact areas at (or on) the trench. For example, no electrical connections (e.g. no vertical electrical connections, or e.g. no vertical electrically conductive structures, or e.g. no via structures) may extend through the electrically insulating layer at (or e.g. in, or e.g. on, or e.g. within) the second enlarged width region 103B. For example, no vertical electrical connections may extend through the electrically insulating layer at the second enlarged width region 103B to any electrode structures (e.g. source electrode structures, or e.g. gate electrode structures, or e.g. any other electrode structures) located above the electrically insulating layer. For example, no vertical electrical connections may be connected to the at least one electrically conductive trench structure located in the trench 101 at the second enlarged width region 103B.

A second vertical electrically conductive structure of the first trench 101 may be electrically connected to the second electrically conductive trench structure located in the first trench 101 at a third enlarged width region of the plurality of enlarged width regions 103 of the first trench 101. For example, a direct electrical connection between the second vertical electrically conductive structure of the first trench 101 and the second electrically conductive trench structure may be located in (or at) the third (different from the first) enlarged width region of the plurality of enlarged width regions 103 of the first trench 101. For example, the second vertical electrically conductive structure of the first trench 101 may be electrically connected between the second electrically conductive trench structure located in the first trench 101 and an electrode structure (e.g. to the first electrode structure).

The first vertically electrically conductive structure 107 of the first trench 101 may be one of a plurality (e.g. two or e.g. three, or e.g. more than ten, or e.g. more than hundred) of first vertically electrically conductive structures of the first trench 101 electrically connected to the first electrically conductive trench structure located in the first trench 101. The second vertically electrically conductive structure of the first trench 101 may be one of a plurality (e.g. two or e.g. three, or e.g. more than ten, or e.g. more than hundred) of second vertically electrically conductive structures of the first trench 101 electrically connected to the second electrically conductive trench structure located in the same trench 101.

At each respective trench 101 of the plurality of trenches, a plurality of first vertically electrically conductive structures 107 may be electrically connected to a first electrically conductive trench structure located in the trench 101, for example. A plurality of second vertically electrically conductive structures may be electrically connected to a second electrically conductive trench structure located in the same trench 101, for example.

The first electrode structure may be a metallization (e.g. copper or aluminum) or polysilicon layer structure arranged above or on (e.g. directly on) the electrically insulating layer, for example. The second electrode structure may also be a metallization or polysilicon layer structure arranged above the electrically insulating layer, for example. The second electrode structure may be electrically insulated from the first electrode structure by a further (or second) electrically insulating layer, which may be located between the first electrode structure and the second electrode structure, for example. Optionally, the second electrode structure may be located above, or alternatively below, or alternatively at the same level as) the first electrode structure, provided the second electrode structure is electrically insulated from the first electrode structure.

The number of enlarged width regions of the first trench 101 may be larger than the number of first vertical electrically conductive structures 107 electrically connected to the first electrically conductive trench structure located in the first trench 101 and the number of second vertical electrically conductive structures electrically connected to the second electrically conductive trench structure located in the first trench 101 (e.g. larger than the total number or sum of the first vertical electrically conductive structures 107 electrically connected to the first electrically conductive trench structure located in the first trench 101 and the second vertical electrically conductive structures electrically connected to the second electrically conductive trench structure located in the first trench 101.

Optionally, each trench 101 of the plurality of trenches 101 may have a total number of enlarged width regions which is larger than the total number of vertical electrically conductive structures connected to the (one or more) electrically conductive structures located in the trench 101. Alternatively or optionally, at least one trench 101 (or some trenches 101) of the plurality of trenches 101 may have a number of enlarged width regions equal to the number of vertical electrically conductive structures connected to the at least one electrically conductive structure located in the trench 101.

Optionally, the (total) number of enlarged width regions of the plurality of trenches 101 of the semiconductor device 100 may be larger than the (total) number vertical electrically conductive structures connected to the electrically conductive trench structures located in the plurality of trenches 101.

In examples of the semiconductor device 100, the first vertical electrically conductive structure 107 of the first trench 101 and the second vertical electrically conductive structure of the first trench 101 may be electrically connected to the electrode structures in different configurations. For example, the first vertical electrically conductive structure 107 of the first trench 101 may be electrically connected to the first electrode structure and the second vertical electrically conductive structure of the first trench 101 may be electrically connected to a different second electrode structure. Alternatively, the first vertical electrically conductive structure 107 of the first trench 101 and the second vertical electrically conductive structure of the first trench 101 may be electrically connected to the same electrode structure (e.g. to the first electrode structure or to the second electrode structure). For example, one of the first electrode structure and the second the electrode structure may be a gate electrode structure, and the other of the first electrode structure and the second the electrode structure may be a source electrode structure.

In an example of the semiconductor device 100 (e.g. a normal speed variation of the semiconductor device 100), the first vertical electrically conductive structure 107 may be electrically connected to the first electrode structure and the second vertical electrically conductive structure may be electrically connected to the second electrode structure.

The first electrode structure may be a metallization structure for providing a first potential to the first electrically conductive trench structure located in the first trench 101, and to the first electrically conductive trench structure located in the second trench 101, for example. The first electrode structure may be a gate metallization layer structure for providing a gate potential to the first electrically conductive trench structure located in the first trench 101, and to the first electrically conductive trench structure located in the second trench 101, for example.

The second electrode structure may be a metallization structure for providing a second different potential to the second electrically conductive trench structure and to the second electrically conductive trench structure located in the second trench 101, for example. The second electrode structure may be a source metallization layer structure for providing a source potential to the second electrically conductive trench structure and to the second electrically conductive trench structure located in the second trench 101, for example.

Due to the second electrically conductive trench structure being connected to the second (e.g. source) potential, and the first electrically conductive trench structures being connected to the first (e.g. gate) potential, some of the gate-drain capacitance may be converted to source-drain capacitance which may allow for a transistor cell to be switched with a lower gate charge. This may further reduce switching losses in the transistor cell compared to transistor cells with only one electrically conductive trench structure, for example.

The first trench 101 may be located adjacently to a neighboring or successive (substantially parallel) second trench 101 of the plurality of trenches 101. Optionally, a first electrically conductive trench structure located in the second neighboring trench 101 may be electrically connected to the first electrode structure via a first vertical electrically conductive structure 107 of the second trench 101. Additionally, a second electrically conductive trench structure located in the second trench 101 may be electrically connected to the second electrode structure via a second vertically electrically conductive structure of the second trench 101.

Optionally, all the upper polysilicon trench structures (e.g. all the first electrically conductive trench structures) located in the plurality of trenches 101 may be connected to gate potential. Additionally or optionally, all lower polysilicon trench structures (e.g. all the second electrically conductive trench structures) located in the plurality of trenches 101 may be connected to source potential.

In another example of the semiconductor device 100 (e.g. a low speed variation of the semiconductor device 100), the first vertical electrically conductive structure 107 may be electrically connected to the first electrically conductive trench structure at a first enlarged width region 103A of the plurality of enlarged width regions 103 of the first trench 101. The second vertical electrically conductive structure may be electrically connected to the second electrically conductive trench structure located in the first trench 101 at a third enlarged width region 103C of the plurality of enlarged width regions 103 of the first trench 101.

The first vertical electrically conductive structure 107 of the first trench 101 and the second vertical electrically conductive structure of the first trench 101 may be electrically connected to the same first electrode structure. For example, the first electrode structure may be a metallization structure for providing a first potential to the first electrically conductive trench structure and to the second electrically conductive trench structure located in the first trench 101. For example, the first electrode structure may be a gate metallization layer structure for providing a gate potential to the first electrically conductive trench structure and to the second electrically conductive trench structure located in the first trench 101.

Due to the second electrically conductive trench structure in the first trench 101 being electrically connected to the same potential (e.g. gate voltage) as the first electrically conductive trench structure in the first trench 101, the turn on resistance of a transistor cell adjacent to the first trench 101 may be reduced (thus Ron*A may be improved), and the parasitic capacitance (or charge, Qgd) between gate electrode and drain electrode may increase (slightly). A physical effect may be an enlargement of a low ohmic accumulation channel along a sidewall of the trench.

The first electrode structure may further provide the first (e.g. gate) potential to the first electrically conductive trench structure located in the neighboring second trench 101 via the first vertical electrically conductive structure 107 of the second trench 101, for example.

The second electrode structure may be a metallization structure for providing a second different potential to the second electrically conductive trench structure located in the second trench 101 via the second vertical electrically conductive structure of the second trench 101, for example. The second electrode structure may be a source metallization layer structure for providing a source potential to the second electrically conductive trench structure located in the second trench 101 via the second vertical electrically conductive structure of the second trench 101, for example.

Optionally, the plurality of trenches 101 may include a plurality of first trenches 101 and a plurality of second trenches 101 arranged alternatingly in a second lateral direction. For example, all upper polysilicon trench structures (e.g. all first electrically conductive trench structures) located in the plurality of trenches 101 may be connected to a gate potential, for example. Additionally or optionally, some lower polysilicon trench structures located in the plurality of trenches 101 may be connected to the same gate potential. For example, the second electrically conductive trench structures may be alternatingly connected to source potential or gate potential.

In another example of the semiconductor device 100 (e.g. a high speed variation of the semiconductor device 100), the first electrode structure may be a metallization structure for providing a second potential (e.g. the same potential) to the first electrically conductive trench structure and to the second electrically conductive trench structure located in the first trench 101. For example, the first electrode structure may be a source metallization layer structure for providing a source potential to the first electrically conductive trench structure and to the second electrically conductive trench structure located in the first trench 101.

Due to the second electrically conductive trench structure in the first trench 101 being electrically connected to the same potential (e.g. the source voltage) as the first electrically conductive trench structure in the first trench 101, the turn on resistance of a transistor cell adjacent to the first trench may be increased (e.g. Ron*A may increase slightly), and the parasitic capacitance (or charge, Qgd) between gate electrode and drain electrode may decrease (remarkably). A physical effect may be change of the parasitic capacitance (or charge, Qgd) and therefore an improvement of the fast switching performance.

The first electrode structure may further provide the second (e.g. the source potential) to the second electrically conductive trench structure located in the neighboring second trench 101, for example. The second electrode structure may be a metallization structure for providing a first potential to the first electrically conductive trench structure located in the second trench 101, for example. The second electrode structure may be a gate metallization layer structure for providing a gate potential to the first electrically conductive trench structure located in the second trench 101, for example.

Optionally, all lower polysilicon trench structures (e.g. all second electrically conductive trench structures) located in the plurality of trenches 101 may be connected to a source potential, for example. Additionally or optionally, some upper polysilicon trench structures (e.g. some or alternate first electrically conductive trench structures) located in the plurality of trenches 101 may be connected to the same source potential). For example, the first electrically conductive trench structures may be alternatingly connected to source potential or gate potential.

The semiconductor device 100 is not necessarily limited to the normal speed (having a speed between low speed and high speed), the low speed and the high speed variations described herein. Different sequences may be applied such that instead of a single alternating arrangement (e.g. one low speed or high speed trench located between neighboring normal speed trenches), different alternating arrangements may be applied. For example, more than one low or high speed trench may be located (laterally) between neighboring normal speed trenches. Alternatively or optionally, more than one normal speed trench may be located (laterally) between more than one low or high speed trenches or vice versa.

The semiconductor device 100 may be a metal oxide semiconductor field effect transistor (MOSFET) device, an insulated gate bipolar transistor (IGBT) device, or a junction field effect transistor (JFET) device, for example. For example, the semiconductor device 100 may include at least one MOSFET transistor cell, at least one IGBT transistor cell or at least one JFET transistor cell, for example. For example, the at least one electrically conductive trench structure may include (or may be) a gate of a metal oxide semiconductor field effect transistor cell, a gate of an insulated gate bipolar transistor cell or a gate of a junction field effect transistor cell.

In the case of the semiconductor device 100 including a MOSFET transistor cell or an IGBT transistor cell, each MOSFET or IGBT transistor cell may include a source or emitter region having a first conductivity type (e.g. n+ or n++ doped), a body region having a second conductivity type (e.g. p-type doped) and a drift region (e.g. n-type doped).

In the case of the semiconductor device 100 including a MOSFET transistor cell a drift region of the MOSFET transistor cell may be located between a body region of the MOSFET transistor cell and a drain region of the MOSFET transistor cell located at a second lateral side (e.g. a back side surface) of the semiconductor substrate 102. The drain region of the MOSFET transistor cell may have the first conductivity type (e.g. n+ or n++ doped), for example.

In the case of the semiconductor device 100 including an IGBT transistor cell, the drift region of the IGBT transistor cell may be located between a body region of the IGBT transistor cell and an emitter/collector region of the IGBT transistor cell located at the second lateral side (e.g. a back side surface) of the semiconductor substrate 102. The second emitter/collector region of the IGBT transistor cell may have the second conductivity type (e.g. p+ doped). Optionally, a highly doped field stop region having the first conductivity type (e.g. n+ doped) may be located between the drift region and the second emitter/collector region of the IGBT transistor cell.

The first source or emitter region, the body region and/or the drift region of a transistor cell may be located adjacently to each trench 101 (e.g. adjacently to a sidewall of each trench 101.

The plurality of trenches 101 may extend vertically into the drift region towards the drain or collector region located at the second lateral side (back side surface) of the semiconductor substrate 102. For example, the plurality of trenches 101 may extend into the drift region by greater than 30% (or e.g. larger than 50%, or e.g. larger than 80%) of a vertical dimension of the drift region.

The first electrically conductive trench structure located in the trench 101 may be located laterally adjacent to the body region and/or to the source or emitter region of the MOSFET or IGBT transistor cell. For example, the first electrically conductive trench structure may extend vertically between the source region and the drift region. For example, the first electrically conductive trench structure may extend vertically from the front side surface of the semiconductor substrate 102 towards the drift region.

The second electrically conductive trench structure, located between the bottom of the trench and the first electrically conductive trench structure may be located laterally adjacently to the drift region of the MOSFET or IGBT transistor cell, for example.

When a first gate voltage (or potential) is applied to the first electrically conductive trench structure, the MOSFET or IGBT transistor cell may be switched to an on-state. When the MOSFET or IGBT FET transistor cell is in an on-state, a conductive channel (e.g. an n-channel) may be formed (or induced) in the body region between the source region and the drift region of the MOSFET or IGBT transistor cell. The conductive channel may be formed in a part of the body region adjacent to the first electrically conductive trench structure, and a current flow may occur between the source region of the transistor cell (at the first lateral side of the semiconductor substrate) and the drift region of the transistor cell.

When a second gate voltage (or potential) is applied the first electrically conductive trench structure, the MOSFET or IGBT transistor cell may be switched to an off-state. When the MOSFET or IGBT FET transistor cell is in an off-state, a depletion region may be formed partly in the drift region of the MOSFET or FET transistor cell and current flow between the source region of the transistor cell and the drift region of the transistor cell may be reduced or terminated, for example.

Each semiconductor device 100 may be a power semiconductor device having a breakdown voltage or blocking voltage of more than 10V (e.g. a breakdown voltage of 10 V, 20 V or 50V), more than 100 V (e.g. a breakdown voltage of 200 V, 300 V, 400V or 500V) or more than 500 V (e.g. a breakdown voltage of 600 V, 700 V, 800V or 1000V) or more than 1000 V (e.g. a breakdown voltage of 1200 V, 1500 V, 1700V, 2000V, 3300V or 6500V), for example.

The semiconductor substrate 102 may be a silicon-based semiconductor substrate (e.g. a silicon substrate). For example, the semiconductor substrate 102 may be float zone (FZ) silicon-based semiconductor substrate or a Czochralski (CZ) silicon-based semiconductor substrate. Optionally or alternatively, the semiconductor substrate 102 may be a silicon carbide (SiC)-based semiconductor substrate, or gallium arsenide (GaAs)-based semiconductor substrate, or a gallium nitride (GaN)-based semiconductor substrate, for example.

The first lateral surface or front side surface of the semiconductor substrate 102 may be a surface of the semiconductor substrate 102 towards metal layers, insulation layers and/or passivation layers on top of the surface of the substrate or a surface of one of these layers. For example, a semiconductor substrate 102 front side may be the side at which active elements of the chip are formed. For example, in a power semiconductor chip, a chip front side may be a side of the chip at which a source region and a gate region are formed, and a chip back side may be a side of the chip at which a drain region is formed. For example, more complex structures may be located at the chip front side than at the chip back side.

The examples described herein relate a drain region located at the chip back side and a source region located at the chip front side, it may be understood that the semiconductor device may include other configurations. For example, optionally, in a source-down configuration, a drain region may be located at the chip front side.

A lateral surface of the semiconductor substrate 102 may be a substantially even plane (e.g. neglecting unevenness of the semiconductor structure due to the manufacturing process and trenches). For example, the lateral dimension of the lateral surface of the semiconductor substrate 102 may be more than 100 times larger (or more than 1000 times or more than 10000 times) than a maximal height of structures on the main surface. In comparison to a basically vertical edge (e.g. resulting from separating the substrate of the chip from others) of the semiconductor substrate 102, the lateral surface may be a basically horizontal surface extending laterally. The lateral dimension of the lateral surface of the semiconductor substrate 102 may be more than 100 times larger (or more than 1000 times or more than 10000 times) than a basically vertical edge of the semiconductor substrate 102, for example.

The first lateral direction may be a direction substantially parallel to a lateral surface of the semiconductor substrate, for example. The second lateral direction may be a direction substantially parallel to the lateral surface of the semiconductor substrate, and orthogonal (or perpendicular) to the first lateral direction, for example. A vertical direction may be a direction orthogonal (or perpendicular) to the lateral surface of the semiconductor substrate, for example.

A region comprising the first conductivity type may be a p-type doped region (e.g. caused by incorporating aluminum ions or boron ions) or an n-type doped region (e.g. caused by incorporating nitrogen ions, phosphor ions or arsenic ions). Consequently, the second conductivity type indicates an opposite n-type doped region or p-type doped region. In other words, the first conductivity type may indicate an n-type doping and the second conductivity type may indicate a p-type doping or vice-versa.

New generation power FETs (e.g. MOSFETs) may frequently have application specific requirements. For example, the exact optimization for certain applications may be required. In particular, the optimization for different applications may require the use of transistors having different speed variations (e.g. high speed variations optimized for fast switching and low speed variations optimized for small Ron*A variations). The different applications may require switching based on different Ron*A (turn-on resistance), gate charges (e.g. Qgd) or fast switching, for example. The various examples described herein (above and/or below) may show how such application requirements may be met.

In order to produce normal speed, low speed or high speed semiconductor devices, an extra individual layout with a full mask may have to be customized for each specific device. (For example, each type of semiconductor device may require different masks to vary the number of contact holes for forming vertical electrically conductive structures and different masks to vary the number of enlarged regions at which the contact holes are to be formed.) This may be time-demanding for the layout and may generates high mask costs (e.g. for producing a full mask set). Additionally, the individual layouts of such speed variations may be error-prone.

Instead of preparing an individual mask for each specific type of semiconductor device, a ground layout including the maximum number of all contact possibilities for both electrode structures (or trench structures) in the trench for a set of transistor cells may be prepared. (For example, a mask may provide a ground layout for forming the maximum number of enlarged width regions in the trenches). The additional inactive contacts (or enlarged width regions) may be recognized in the layout by a dog-bone shaped widening of the trench layout (e.g. the enlarged width regions). Some of the enlarged width regions (possible contact regions) may be may be free at the end (e.g. at a first group of the total number of enlarged width regions, no contact holes or vertically electrically conductive structures are formed), for example. Some of the enlarged width regions may be applied to the contact (or electrode structure) to form realized contacts (e.g. at a second group of the total number of enlarged width regions, contact holes and vertically electrically conductive structures are formed), for example. A contact strip may be seen at the contact (e.g. at the second group enlarged width regions) at these locations.

The realized contacts and the inactive contacts may be formed for the respective speed-variations. For example, the number of realized contacts and/or the number of inactive contacts may be varied for high speed, low speed or normal speed semiconductor devices. The different variations may be easily implemented. For example, any preferred ratio of the number of trenches with special speed contacts to the number of trenches with normal speed contacts (1:n) may be easy to adjust, for example. Furthermore, the error rate of the different 1:n layouts may be reduced, as a mask with inactive contacts can be provided, which can be fixed as a library cells. Only the contact mask (e.g. the mask for producing contact holes for vertically electrically conductive structures) is individually adjusted to the layout.

The various examples described relate to a flexible layout for high speed, normal speed and low speed variations of trench MOSFETs. At every point, the maximal required number of contact possibilities may be provided with inactive contacts. The concrete contacting may be carried individually by flexible photo techniques (for producing contact holes) for semiconductor devices having different speeds (e.g. every 1:n ratio). All combinations or intermediate values of high speed or low speed variations with ratios 1:n (number of high or low speed trenches: number of normal speed trenches) are possible. n may be an integer value greater than or equal to 1 representing the number of normal speed trenches, for example. Additionally or optionally, transistor cells with more than 2 polysilicon electrode trench structures in the trench may be possible, and may be realized through a sufficient number of inactive contacts, for example.

Figure 2A:
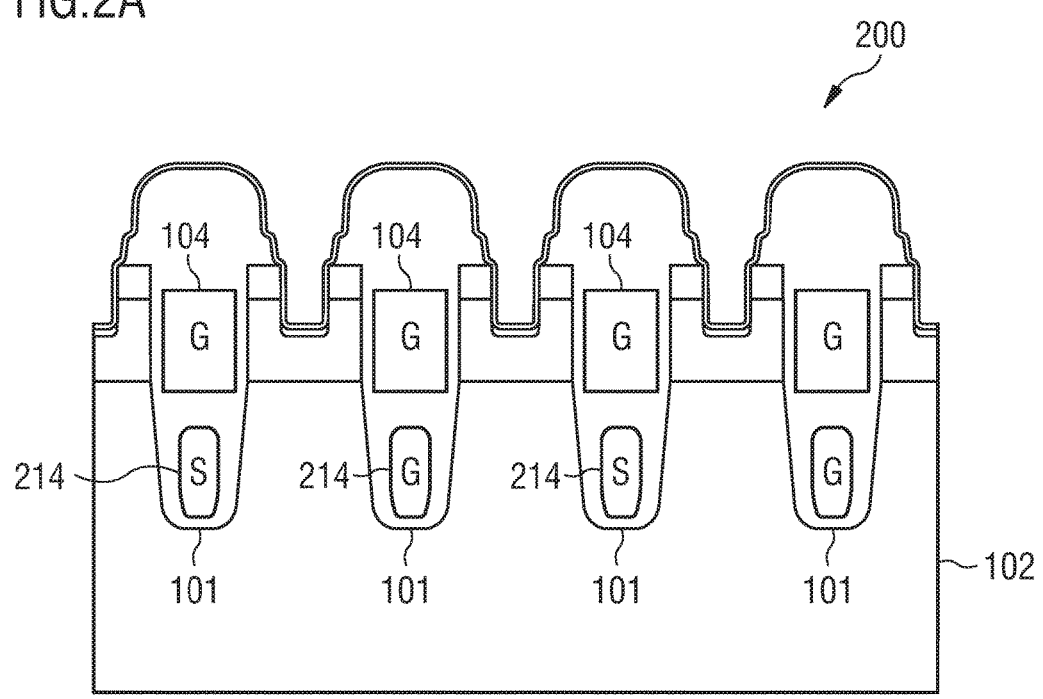

FIGS. 2A and 2B show schematic illustrations of a vertical cross-section and a top view respectively of a semiconductor device 200 according to an embodiment. The semiconductor device 200 may be a low speed variation with inactive contacts, for example.

As described in connection with FIG. 1, the semiconductor device 200 may include the plurality of trenches 101 extending into the semiconductor substrate 102. A first electrically conductive trench structure 104 and a second electrically conductive trench structure 214 may be located in each trench 101 of the plurality of trenches 101.

The first vertical electrically conductive structure 107 of the first trench 101 may be electrically connected to the first electrically conductive trench structure 104 located in the first trench 101. The first vertical electrically conductive structure 107 of the first trench 101 may be electrically connected to the first electrically conductive trench structure 104 at a first enlarged width region 103A of the plurality of enlarged width regions 103 of the first trench 101.

The second vertical electrically conductive structure 217 of the first trench 101 may be electrically connected to the second electrically conductive trench structure 214 located in the first trench 101 at a third enlarged width region 103C of the plurality of enlarged width regions 103 of the first trench 101.

The first trench 101 may include at least one second enlarged width region 103B without any vertical electrical connections connected to the first electrically conductive trench structure 104 and to the second electrically conductive trench structure 214 located in the trench 101 at the second enlarged width region 103B.

The first vertical electrically conductive structure 107 and the second vertical electrically conductive structure 217 may be electrically connected to the same first electrode structure as shown in schematic portion 206. For example, the first electrode structure may be a gate metallization layer structure for providing a gate potential to the first electrically conductive trench structure 104 and to the second electrically conductive trench structure 214 located in the first trench 101.

A first electrically conductive trench structure 104 located in the neighboring second trench 101 may be electrically connected to the first electrode structure via a first vertical electrically conductive structure 107 of the second trench 101 as shown in schematic portion 206. Thus, the first electrode structure may providing a gate potential to the first electrically conductive trench structure 104 located in the second trench 101, for example.

A second electrically conductive trench structure 214 located in the second trench 101 may be electrically connected to the second electrode structure via a (second) vertically electrically conductive structure 217 of the second trench 101 as shown in schematic portion 208. The second electrode structure may be a source metallization layer structure for providing a source potential to the second electrically conductive trench structure 214 located in the second trench 101, for example.

The first electrode structure (e.g. the gate metallization layer structure) may include one or more gate runner or gate finger leads. At the gate runner or gate finger leads, all contact possibilities are exhausted (or used), for example.

The second electrode structure (e.g. the source metallization structure) may include one or more source finger leads. At the source fingers of the source metallization structure, electrical contact may be made with the upper polysilicon contacts and lower polysilicon contacts located in the plurality of trenches 101 (although optionally for some low speed devices, none of the upper polysilicon contacts are connected to the source potential). For example, every second lower polysilicon trench structure may be connected to the source potential). All others (e.g. the other lower polysilicon trench structures) may be at inactive or free contacts areas (e.g. they are not connected to the source finger leads).

FIG. 2C shows a schematic illustration 230 of the cross-section D-D' and the cross-section E-E' through one trench (e.g. trench 101) of the plurality of trenches.

FIG. 2C shows how a first electrically conductive trench structure 104 located in the second trench 101 may be electrically connected to the first electrode structure 106 via a first vertical electrically conductive structure 107 of the second trench 101. Furthermore, FIG. 2C shows a second electrically conductive trench structure 214 located in the second trench 101 may be electrically connected to the second electrode structure 108 via a second vertically electrically conductive structure 217 of the second trench 101, for example.

The second (or bottom) electrically conductive trench structure 214 may include a laterally extending portion extending in the first lateral direction and a vertically extending portion extending towards the surface of the semiconductor substrate 102. The second electrically conductive trench structure 214 may thus be electrically connected to the second vertically electrically conductive structure 217 of the second trench 101 at the surface of the semiconductor substrate 102, for example. The vertically extending portion of the second (or bottom) electrically conductive trench structure 214 may be electrically insulated from the first electrically conductive trench structure 204 located the same trench 101 by the electrically insulating material (e.g. a gate oxide, e.g. silicon oxide) located in the trench 101, for example.

More details and aspects are mentioned in connection with the embodiments described above or below. The embodiments shown in FIGS. 2A to 2C may comprise one or more optional additional features corresponding to one or more aspects mentioned in connection with the proposed concept or one or more embodiments described above (e.g. FIG. 1) or below (FIGS. 3A to 10).

Figure 3A:
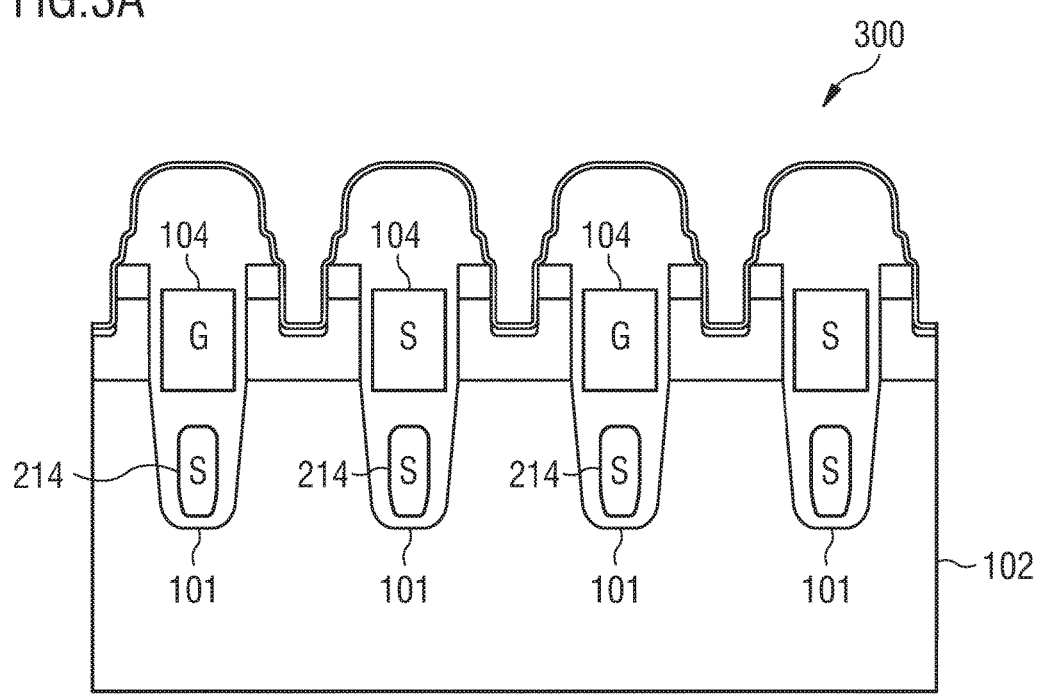

FIGS. 3A and 3B show schematic illustrations of a vertical cross-section and a top view respectively of a semiconductor device 300 according to an embodiment. The semiconductor device 300 may be a high speed variation with inactive contacts, for example.

As described in connection with FIG. 1, the semiconductor device 300 may include the plurality of trenches 101 extending into the semiconductor substrate 102. A first electrically conductive trench structure 104 and a second electrically conductive trench structure 214 may be located in each trench 101 of the plurality of trenches 101.

The first vertical electrically conductive structure 107 may be electrically connected to the first electrically conductive trench structure 104 located in the first trench 101. The first vertical electrically conductive structure 107 may be electrically connected to the first electrically conductive trench structure 104 at a first enlarged width region 103A of the plurality of enlarged width regions 103 of the first trench 101.

The second vertical electrically conductive structure 217 may be electrically connected to the second electrically conductive trench structure 214 located in the first trench 101 at a third enlarged width region 103C of the plurality of enlarged width regions 103 of the first trench 101.

The trench 101 may include at least one second enlarged width region 103B without any vertical electrical connections connected to the first electrically conductive trench structure 104 and to the second electrically conductive trench structure 214 located in the trench 101 at the second enlarged width region 103B.

The first vertical electrically conductive structure 107 and the second vertical electrically conductive structure 217 may be electrically connected to the same first electrode structure as shown in schematic portion 308.

The first electrode structure may be a source metallization layer structure for providing a source potential to the first electrically conductive trench structure 104 and to the second electrically conductive trench structure 214 located in the first trench 101, for example.

A second electrically conductive trench structure 214 located in the second trench 101 may be electrically connected to the first electrode structure via a second vertically electrically conductive structure 217 of the second trench 101 as shown in schematic portion 308. Thus, the first electrode structure may provide a source potential to the second electrically conductive trench structure 214 located in the second trench 101.

A first electrically conductive trench structure 104 located in the second trench 101 may be electrically connected to the second electrode structure via a first vertical electrically conductive structure 107 of the second trench 101 as shown in schematic portion 306. The second electrode structure may be a gate metallization layer structure for providing a gate potential to the first electrically conductive trench structure 104 located in the second trench 101, for example.

The gate metallization layer structure may include one or more gate runner or gate finger leads. At the gate runner or gate finger leads, electrical contact may be made with the upper polysilicon and lower polysilicon contacts located in the plurality of trenches 101 (although optionally for some high speed devices, none of the lower polysilicon contacts are connected to the gate potential). For example, every second upper polysilicon trench structure may be connected to the gate potential).

Optionally, all lower polysilicon trench structures (e.g. all second electrically conductive trench structures 214) may be connected to source potential through source fingers of the source metallization structure. For example, all contact possibilities are exhausted at the source fingers.

More details and aspects are mentioned in connection with the embodiments described above or below. The embodiments shown in FIGS. 3A to 3B may comprise one or more optional additional features corresponding to one or more aspects mentioned in connection with the proposed concept or one or more embodiments described above (e.g. FIGS. 1 to 2C) or below (FIGS. 4A to 10).

Figure 4A:
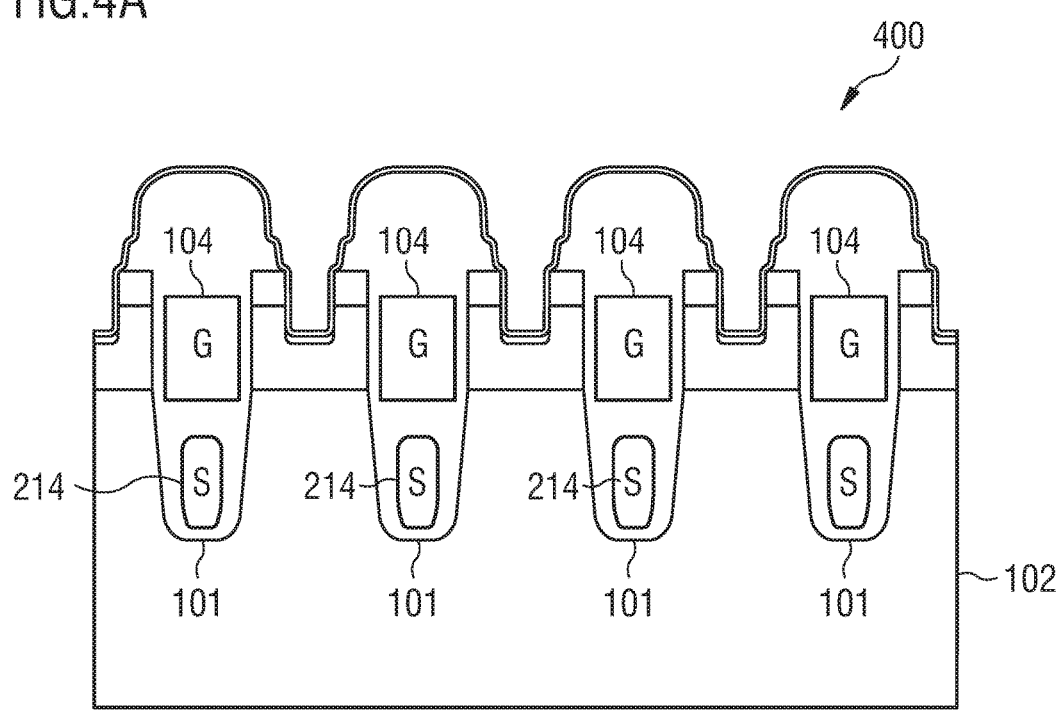

FIGS. 4A and 4B show schematic illustrations of a vertical cross-section and a top view respectively of a semiconductor device 400 according to an embodiment. The semiconductor device 400 may be a normal speed variation, for example.

As described in connection with FIG. 1, the semiconductor device 400 may include the plurality of trenches 101 extending into the semiconductor substrate 102. A first electrically conductive trench structure 104 and a second electrically conductive trench structure 214 may be located in each trench 101 of the plurality of trenches 101.

The first vertical electrically conductive structure 107 may be electrically connected to the first electrode structure as shown in schematic portion 406. The first electrode structure may be a gate metallization layer structure for providing a gate potential to the first electrically conductive trench structure 104 located in the first trench 101.

The second vertical electrically conductive structure 217 may be electrically connected to the second electrode structure as shown in schematic portion 408. The second electrode structure may be a source metallization layer structure for providing a source potential to the second electrically conductive trench structure 214 located in the first trench 101.

A first electrically conductive trench structure 104 located in the second trench 101 may be electrically connected to the first electrode structure via a first vertical electrically conductive structure 107 of the second trench 101 as shown in schematic portion 406. The first electrode structure may provide a gate potential to the first electrically conductive trench structure 104 located in the second trench 101.

A second electrically conductive trench structure 214 located in the second trench 101 may be electrically connected to the second electrode structure via a second vertically electrically conductive structure 217 of the second trench 101 as shown in schematic portion 408. The second electrode structure may provide a source potential to the second electrically conductive trench structure 214 located in the second trench 101.

For example, all upper polysilicon trench structures (e.g. all first electrically conductive trench structures 104) located in the plurality of trenches 101 may be connected to gate potential. Additionally or optionally, all lower polysilicon trench structures (e.g. all second electrically conductive trench structures 214) located in the plurality of trenches 101 may be connected to source potential.

Optionally, some or all of the plurality of trenches 101 have no free contact areas (e.g. no second enlarged width regions 103B). Alternatively as shown in FIG. 5, some or all of the plurality of trenches 101 may include at least one second enlarged width region 103B without any vertical electrical connections connected to the electrically conductive trench structures located in the trench 101.

More details and aspects are mentioned in connection with the embodiments described above or below. The embodiments shown in FIGS. 4A to 4B may comprise one or more optional additional features corresponding to one or more aspects mentioned in connection with the proposed concept or one or more embodiments described above (e.g. FIGS. 1 to 3B) or below (FIGS. 5 to 10).

FIG. 5 shows a schematic illustration of a semiconductor device 500 according to an embodiment. The semiconductor device 500 may be a normal speed variation with inactive contacts, for example.

The semiconductor device 500 may include the plurality of trenches 101 extending into the semiconductor substrate 102. The semiconductor device 500 may be similar to the semiconductor device described in connection with FIGS. 4A and 4B, for example.

The plurality of trenches 101 of the semiconductor device 500 may each include one or more first enlarged width regions 103A and/or one or more third enlarged width regions at which vertical electrically conductive structures may be connected to the electrically conductive trench structures located in the trench 101.

The plurality of trenches 101 of the semiconductor device 500 may each further include one or more second enlarged width regions 103B without any vertical electrical connections connected to the electrically conductive trench structures located in the trench 101 at the second enlarged width regions 103B. FIG. 5 shows the presence of inactive contacts at the source fingers of the source metallization structure, for example.

More details and aspects are mentioned in connection with the embodiments described above or below. The embodiments shown in FIG. 5 may comprise one or more optional additional features corresponding to one or more aspects mentioned in connection with the proposed concept or one or more embodiments described above (e.g. FIGS. 1 to 4B) or below (FIGS. 6A to 10).

Figure 6A:
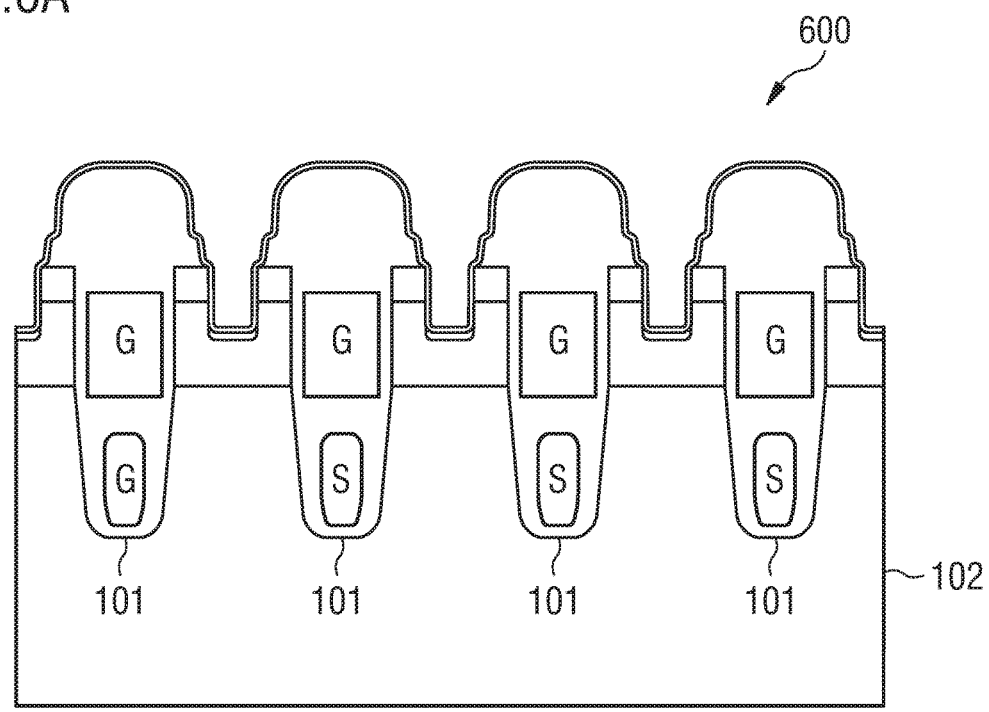

FIGS. 6A and 6B show schematic illustrations of a vertical cross-section and a top view respectively of a semiconductor device 600 according to an embodiment.

The semiconductor device 600 may be similar to the semiconductor device described in connection with FIGS. 1 to 5. However, instead of a single alternating arrangement (e.g. one low speed trench located between neighboring normal speed trenches), three normal speed trenches may be located between neighboring low speed trenches (e.g. a 1:3 arrangement), for example.

The first vertical electrically conductive structure 107 and the second vertical electrically conductive structure 217 of the first trench 101 may be electrically connected to the same first electrode structure as shown in schematic portion 606. For example, the first electrode structure may be a gate metallization layer structure for providing a gate potential to the first electrically conductive trench structure 104 and to the second electrically conductive trench structure 214 located in the first trench 101.

The first electrically conductive trench structures 104 located in the neighboring successive second trench 101, third trench 101 and fourth trench 101 may be electrically connected to the first electrode structure via respective first vertical electrically conductive structures 107 as shown in schematic portion 606. Thus, the first electrode structure may providing a gate potential to the first electrically conductive trench structures 104 located in the second trench 101, the third trench 101 and the fourth trench 101, for example.

The second electrically conductive trench structure 214 located in the neighboring successive second trench 101, third trench 101 and fourth trench 101 may be electrically connected to the second electrode structure via respective second vertically electrically conductive structures as shown in schematic portion 608. The second electrode structure may provide a source potential to the second electrically conductive trench structures 214 located in the second trench 101, the third trench 101 and the fourth trench 101, for example.

By tuning the sequence of normal speed, low speed or high speed trenches, it may be possible to tune the turn-on resistance of the semiconductor device and the parasitic capacitance between the gate electrode and drain electrode, for example.

FIG. 6B shows the presence of inactive contacts at the source fingers of the source metallization structure, for example.

More details and aspects are mentioned in connection with the embodiments described above or below. The embodiments shown in FIGS. 6A to 6B may comprise one or more optional additional features corresponding to one or more aspects mentioned in connection with the proposed concept or one or more embodiments described above (e.g. FIGS. 1 to 5) or below (FIGS. 7 to 10).

FIG. 7 shows a top view schematic illustration of an overview of semiconductor devices having different speeds. For example, FIG. 7 shows an overview of contact possibilities for a flexible layout of the semiconductor device 400 described in connection with FIGS. 4A & 4B (a normal speed semiconductor device), the semiconductor device 300 described in connection with FIGS. 3A & 3B (a high speed semiconductor device) and the semiconductor device 200 described in connection with FIGS. 2A & 2B (a low speed semiconductor device), respectively.

Each semiconductor device 200, 300, 400 may include a plurality of trenches 101, and each trench 101, 101, 101 of the plurality of trenches 101 includes a plurality of enlarged width regions 103 distributed along the trench.

Each semiconductor device may include at least one trench including a plurality of contact holes formed on (or at) the plurality of first enlarged width regions 103A at which realized contacts (e.g. vertical electrically conductive structures) may be connected to an upper polysilicon trench structure (e.g. the first electrically conductive structure, for example). Additionally, each trench may include a plurality of contact holes formed on (or at) the plurality of third enlarged width regions 103C at which realized contacts (e.g. vertical electrically conductive structures) may be connected to a lower polysilicon trench structure (e.g. the second electrically conductive structure), for example. A contact 706A, 716B (or lead or finger, or e.g. an edge contact) of the respective (gate or source) electrode structures may contact the lower polysilicon trench structures in the trenches, for example.

Additionally or optionally, each semiconductor device may include at least one trench including one or more second enlarged width regions 103B without any vertical electrical connections at the second enlarged width regions 103B (e.g. inactive contacts). Optionally, all the plurality of trenches 101 of each semiconductor device may include one or more second enlarged width regions 103B without any vertical electrical connections at the second enlarged width regions 103B, for example.

The schematic illustration shows at least a portion of a metal gate electrode structure (e.g. gate runner metal portions 706 or gate finger metal portions 716 of the gate electrode structure) and at least a portion of a source electrode structure (e.g. source plate with source fingers metal portions 708 of the source electrode structure) formed on the plurality of enlarged regions 103, for example.

At every location (e.g. at every trench) the maximum necessary number of contact possibilities are manufactured (e.g. the maximum number of enlarged regions for receiving vertical electrically conductive structures, or via structures). The concrete contacting may be flexibly carried out for each respective product using photo techniques (e.g. photolithography) to create individual contact holes for each semiconductor device, for example.

Figure 9:
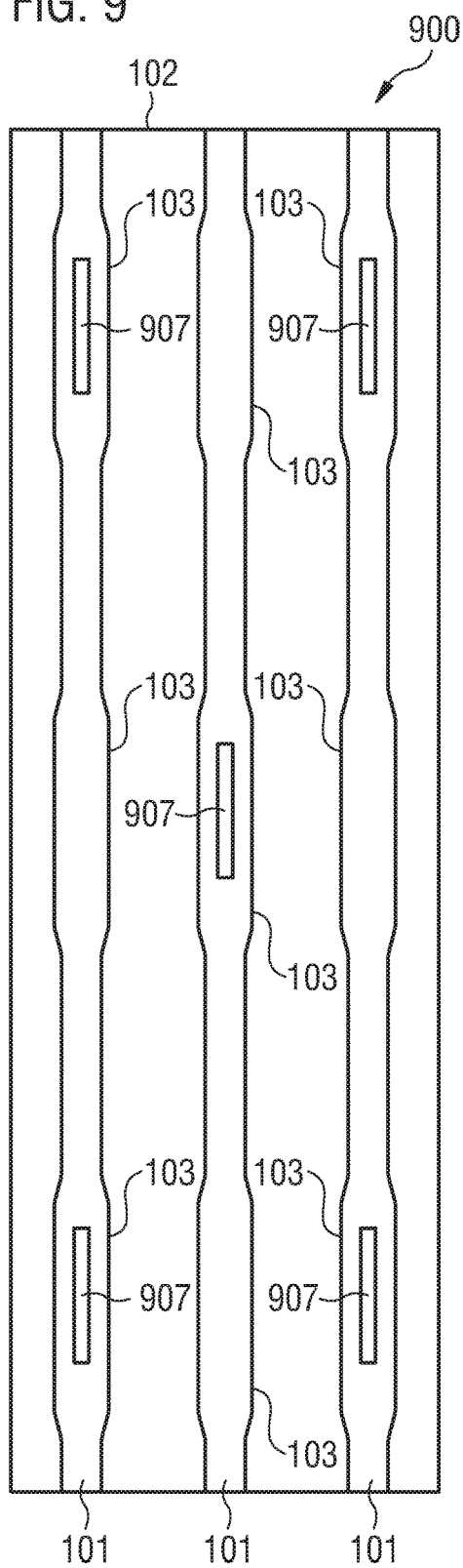
FIG. 9 shows a schematic illustration of a further semiconductor device.
Figure 10:
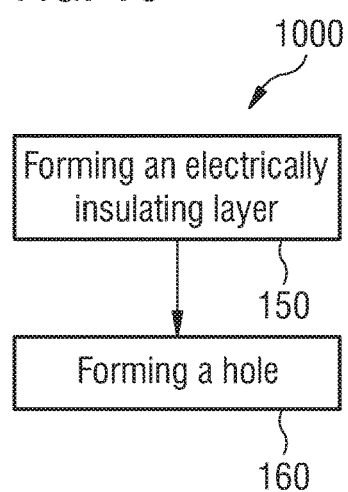
FIG. 10 shows a schematic illustration of a method for forming a semiconductor device.

More details and aspects are mentioned in connection with the embodiments described above or below. The embodiments shown in FIG. 7 may comprise one or more optional additional features corresponding to one or more aspects mentioned in connection with the proposed concept or one or more embodiments described above (e.g. FIGS. 1 to 6B) or below (FIGS. 8 to 10).

Figure 8:
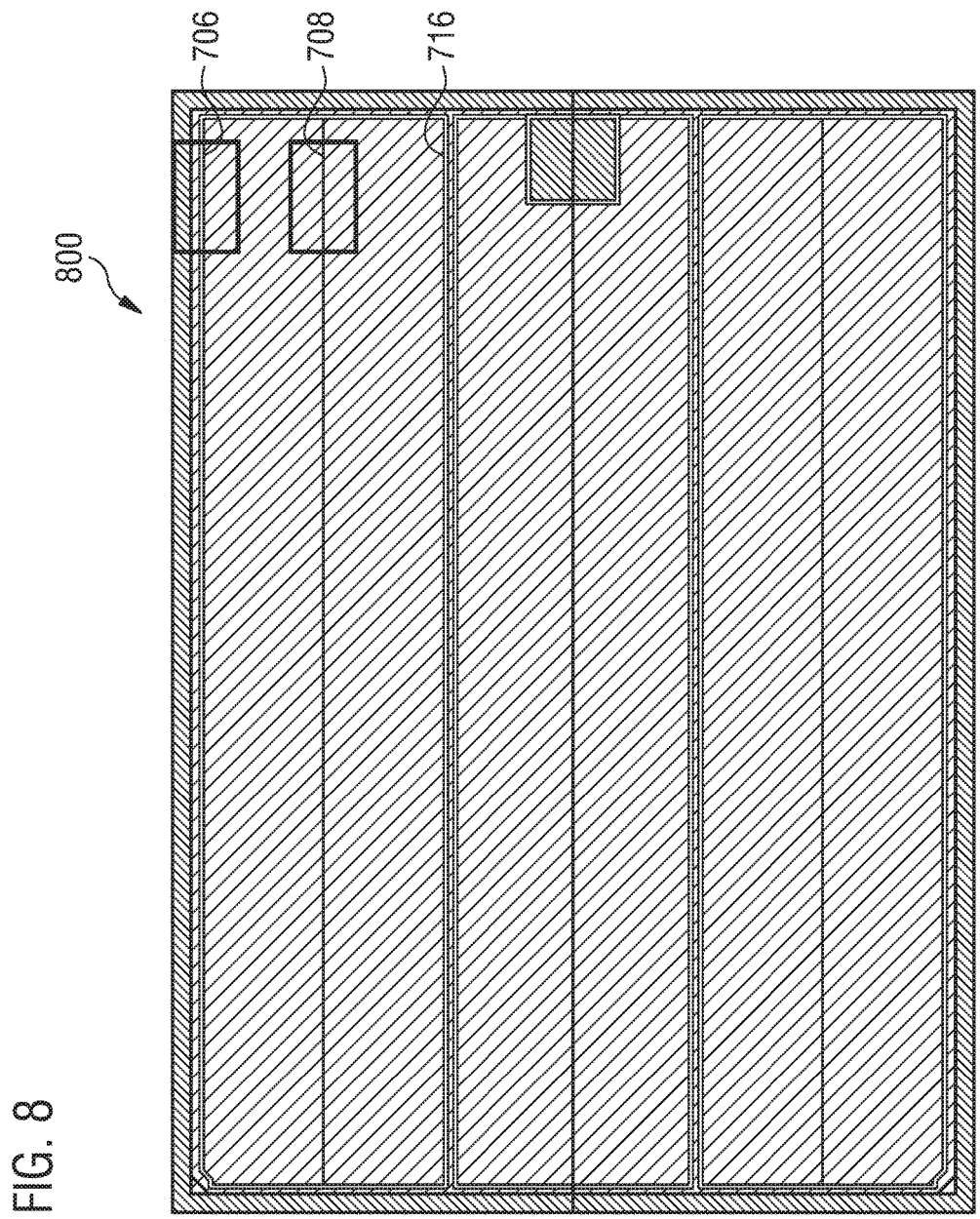
FIG. 8 shows a top view schematic illustration of a semiconductor device including electrode (metallization) structures.

FIG. 8 shows a top view schematic illustration of a semiconductor device 800 including electrode (metallization) structures according to an embodiment. FIG. 8 shows a chip overview, for example.

The semiconductor device 800 may include one or more gate runner portions 706 of a gate electrode structure formed at an edge of the semiconductor substrate. The semiconductor device 800 may further include one or more gate finger portions 716 of the gate electrode structure. The one or more gate runner portions 706 and the one or more gate finger portions 716 of the gate electrode structure may provide a gate potential to the electrically conductive trench structures (e.g. to the upper polysilicon electrically conductive trench structures and/or to the lower polysilicon electrically conductive trench structures) via the vertical electrically conductive structures connected to the gate electrode structure, for example.

The semiconductor device 800 may further include one or more source finger portions 708 (or source plate portions) of a source electrode structure. The source finger portions 708 (or source plate portions) of the source electrode structure may provide a source potential to the electrically conductive trench structures (e.g. to the lower polysilicon electrically conductive trench structure and/or to the upper polysilicon electrically conductive trench structures) via the vertical electrically conductive structures connected to the source electrode structure, for example.

More details and aspects are mentioned in connection with the embodiments described above or below. The embodiments shown in FIG. 8 may comprise one or more optional additional features corresponding to one or more aspects mentioned in connection with the proposed concept or one or more embodiments described above (e.g. FIGS. 1 to 7) or below (FIGS. 9 to 10).

FIG. 9 shows a schematic illustration of a semiconductor device 900 according to an embodiment.

The semiconductor device 900 comprises a plurality of trenches 101 extending into a semiconductor substrate 102. Each trench 101 of the plurality of trenches 101 comprises a plurality of enlarged width regions 103 distributed along the trench 101. A total number of vertical electrically conductive structures 907 connecting electrically conductive trench structures located within the trenches 101 of the plurality of trenches 101 is less than a number of enlarged width regions 103 of the plurality of trenches 101.

Due to the number of vertical electrically conductive structures connecting at least one (e.g. one or more) electrically conductive trench structure located within the trenches of the plurality of trenches being less than a number of enlarged width regions of the plurality of trenches, errors in the semiconductor devices may be reduced. Reduced costs may further be achieved as devices may be contacted to metallization structures through contact holes only if required for the device, for example.

The semiconductor device 900 may be similar to the semiconductor devices described in connection with FIGS. 1 to 8, for example.

The (total) number of enlarged width regions of the plurality of trenches 101 of the semiconductor device 100 may be larger than the (total) number vertical electrically conductive structures connected to the electrically conductive trench structures located in the plurality of trenches 101.

Optionally, each trench 101 (e.g. all trenches) of the plurality of trenches 101 may have a number of enlarged width regions which is larger than the number of vertical electrically conductive structures connected to the at least one electrically conductive structure located in the trench 101. Alternatively or optionally, at least one trench (or some trenches 101) of the plurality of trenches 101 may have a number of enlarged width regions equal to the number of vertical electrically conductive structures connected to the at least one electrically conductive structure located in the trench 101.

More details and aspects are mentioned in connection with the embodiments described above or below. The embodiments shown in FIG. 9 may comprise one or more optional additional features corresponding to one or more aspects mentioned in connection with the proposed concept or one or more embodiments described above (e.g. FIGS. 1 to 8) or below (FIG. 10).

FIG. 10 shows a schematic illustration of a method 1000 for forming a semiconductor device according to an embodiment.

The method 1000 comprises forming 150 an electrically insulating layer between a semiconductor substrate and an electrode structure. The semiconductor substrate comprises a plurality of trenches extending into the semiconductor substrate. Each trench of the plurality of trenches comprises a plurality of enlarged width regions distributed along the trench. At least one electrically conductive trench structure is located in each trench of the plurality of trenches.

The method 1000 further comprises forming 160 at least one a hole extending through the electrically insulating layer at a first enlarged width region of the plurality of enlarged width regions for forming a vertical electrically conductive structure. The trench remains covered by the electrically insulating layer at a second enlarged width region of the plurality of enlarged width regions during the forming of the at least one hole.

Due to the trench remaining covered by the electrically insulating layer at a second enlarged width region of the plurality of enlarged width region, errors in the semiconductor devices may be reduced. Reduced costs may further be achieved as a full mask need not be customized for each device.

The electrically insulating layer may be formed on (e.g. directly) on the front side surface of the semiconductor substrate, for example.

The (contact) hole may be formed by etching through the electrically insulating layer at (or on) the first enlarged width region of the plurality of enlarged width regions. The contact hole may be one of a plurality of contact holes formed by etching through the electrically insulating layer at a plurality of first enlarged width regions.

The at least one contact hole be formed at (or on, or above) the at least one first enlarged width region. The method may further include forming at least one contact hole at (or on, or above) at least one third enlarged width region.

No holes are formed at (or on) the second enlarged width region of the plurality of enlarged width regions. Therefore, the trench remains covered by the electrically insulating layer at a second enlarged width region of the plurality of enlarged width regions during the forming of the at least one hole and/or after the forming of the at least one hole, for example.

The method 1000 may further include forming a vertical electrically conductive structure in each hole. For example, each hole may be filled with electrically conductive material (e.g. a metal, e.g. copper or aluminum). At least one first vertical electrically conductive structure may be formed by filling the hole at (or on) the at least one first enlarged width region. The at least one first vertical electrically conductive structure may thus be electrically connected to the at least one electrically conductive trench structure (e.g. the first electrically conductive trench structure) located in the trench at the first enlarged width region. At least one second vertical electrically conductive structure may be formed by filling the hole at (or on) the at least one third enlarged width region. The at least one second vertical electrically conductive structure may thus be electrically connected to the at least one electrically conductive trench structure (e.g. the second electrically conductive trench structure) located in the trench at the third enlarged width region.

The method 1000 may further include forming an electrode structure on (or above) the electrically insulating layer. The electrode structure may be formed by depositing an electrically conductive material (e.g. a metal layer or e.g. a metal layer stack) on the electrically insulating layer.

The vertical electrically conductive structure (e.g. the first vertical electrically conductive structure and/or the second vertical electrically conductive structure) may be electrically connected to the electrode structure.

A second electrode structure may be formed by depositing an electrically conductive material (e.g. a metal layer or e.g. a metal layer stack). The second electrode structure may be electrically insulated from the first electrode structure by the electrically insulating layer and/or a further (or second) electrically insulating layer, which may be located between the first electrode structure and the second electrode structure, for example. Optionally, the second electrode structure may be located above (or below or at the same level as) the first electrode structure, provided the second electrode structure is electrically insulated from the first electrode structure.

The number of enlarged width regions of the trench may be larger than the number of contact holes formed through the electrically insulating layer. Thus, the number of enlarged width regions of the trench may be larger than the number of vertical electrically conductive structures connected to the at least one electrically conductive structure located in the first trench.

A universal mask for producing a maximum number of contact possibilities for different semiconductor devices on different wafers may be used. For example, low speed semiconductor devices may be produced on a first wafer and high speed semiconductor devices may be produced on a second wafer. A universal mask for producing a maximum number of contact possibilities may be used for both the low speed and the high speed semiconductor devices on the first wafer and the second wafer. In order to reduce costs, manufacturing complexities, and/or errors, only a contact mask for producing contact holes for vertically electrically conductive structures needs to be individually adjusted for the different semiconductor devices on different wafers. Thus, the holes are only manufactured where vertically electrically conductive structures are required. Areas which do not require a vertical electrically conductive structure may remain insulated from any electrode structures.

More details and aspects are mentioned in connection with the embodiments described above or below. The embodiments shown in FIG. 10 may comprise one or more optional additional features corresponding to one or more aspects mentioned in connection with the proposed concept or one or more embodiments described above (e.g. FIGS. 1 to 9) or below.

Various examples relate to flexible layouts for producing freely selectable high speed, normal speed or low speed semiconductor devices (e.g. MOSFET semiconductor devices).

Aspects and features (e.g. the semiconductor device, the plurality of trenches, the first trench, the second trench, the plurality of enlarged width regions, the first enlarged width region, the second enlarged width region, the third enlarged width region, the at least one electrically conductive trench structure, the first electrically conductive trench structure, the second electrically conductive trench structure, the electrically insulating layer, the semiconductor substrate, the electrode structures, the first electrode structure, the second electrode structure, the vertical electrically conductive structures, the first vertical electrically conductive structure, the second vertical electrically conductive structure, the vertical connections, the number of enlarged width regions) mentioned in connection with one or more specific examples may be combined with one or more of the other examples.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A semiconductor device comprising:
    a plurality of trenches extending into a semiconductor substrate, wherein each trench of the plurality of trenches comprises a plurality of enlarged width regions distributed along the trench, and wherein at least one electrically conductive trench structure is located in each trench of the plurality of trenches;
    an electrically insulating layer arranged between the semiconductor substrate and a first electrode structure; and
    a first vertical electrically conductive structure extending through the electrically insulating layer, wherein the first vertical electrically conductive structure forms an electrical connection between the first electrode structure and an electrically conductive trench structure located in a first trench of the plurality of trenches at a first enlarged width region of the plurality of enlarged width regions of the first trench of the plurality of trenches, and
    wherein the electrically insulating layer is arranged between a second enlarged width region of the plurality of enlarged width regions of the first trench and the first electrode structure or a second electrode structure above the second enlarged width region without any vertical electrical connections through the electrically insulating layer at the second enlarged width region.

2. The semiconductor device according to claim 1, wherein a maximum width of the plurality of enlarged width regions is at least 5% larger than a minimum width of the plurality of trenches between two enlarged width regions.

3. The semiconductor device according to claim 1, wherein a minimum width of the plurality of trenches between two enlarged width regions is less than 1 µm.

4. The semiconductor device according to claim 1, wherein the plurality of trenches are arranged substantially parallel to each other.

5. The semiconductor device according to claim 1, wherein an average lateral distance between neighboring trenches of the plurality of trenches is less than 2 times a minimum width of the plurality of trenches between two enlarged width regions.

6. The semiconductor device according to claim 1, wherein the electrically insulating layer is arranged adjacently to a surface of the semiconductor substrate.

7. The semiconductor device according to claim 1, wherein a first electrically conductive trench structure and a second electrically conductive trench structure are located in each trench of the plurality of trenches,
    wherein the first electrically conductive trench structure and the second electrically conductive trench structure are electrically insulated from each other by an electrically insulating material arranged between the first electrically conductive trench structure and the second electrically conductive trench structure.

8. The semiconductor device according to claim 7, wherein a second vertical electrically conductive structure of the first trench is electrically connected to the second electrically conductive trench structure at a third enlarged width region of the first trench.

9. The semiconductor device according to claim 8, wherein the first vertical electrically conductive structure is one of a plurality of first vertical electrically conductive structures electrically connected to the first electrically conductive trench structure located in the first trench, and
    wherein the second vertical electrically conductive structure is one of a plurality of second vertical electrically conductive structures electrically connected to the second electrically conductive trench structure located in the first trench.

10. The semiconductor device according to claim 8, wherein a total number of enlarged width regions of the first trench is greater than a number of enlarged width regions comprising first vertical electrically conductive structures electrically connected to the first electrically conductive trench structure located in the first trench and a number of enlarged width regions comprising second vertical electrically conductive structures electrically connected to the second electrically conductive trench structure located in the first trench.

11. The semiconductor device according to claim 8, wherein the first vertical electrically conductive structure of the first trench is electrically connected to the first electrode structure and the second vertical electrically conductive structure of the first trench is electrically connected to the second electrode structure.

12. The semiconductor device according to claim 8, wherein the first vertical electrically conductive structure of the first trench and the second vertical electrically conductive structure of the first trench are electrically connected to the first electrode structure.

13. The semiconductor device according to claim 1, wherein one of the first electrode structure and the second electrode structure is a gate electrode structure, and wherein the other of the first electrode structure and the second electrode structure is a source electrode structure.

14. The semiconductor device according to claim 1, wherein the first trench is located adjacently to a second trench of the plurality of trenches, wherein a first electrically conductive trench structure located in the second trench is electrically connected to the first electrode structure via a first vertical electrically conductive structure of the second trench, and wherein a second electrically conductive trench structure located in the second trench is electrically connected to the second electrode structure via a second vertical electrically conductive structure of the second trench.

15. The semiconductor device according to claim 1, wherein the plurality of trenches comprises at least 10% of all trenches extending into the semiconductor substrate.

16. The semiconductor device according to claim 1, wherein a blocking voltage of the semiconductor device is greater than 10 V.

17. The semiconductor device according to claim 1, wherein:
each trench of the plurality of trenches comprises the plurality of enlarged width regions and a plurality of narrow width regions distributed along the trench in a first lateral direction, and
each of the plurality of enlarged width regions of the plurality of trenches is adjacent, in a second lateral direction, to a narrow width regions of the plurality of narrow width regions of an adjacent trench of the plurality of trenches.

18. The semiconductor device according to claim 1, wherein:
the electrically insulating layer is arranged on the semiconductor substrate between the semiconductor substrate and the first electrode structure, the first electrode structure being disposed on the electrically insulating layer, and
the electrically insulating layer above the second enlarged width region is void of vertical electrical connections such that the first electrode structure or the second electrode structure above the second enlarged width region is vertically insulated from the second enlarged width region of the first trench.

19. The semiconductor device according to claim 8, wherein the second vertical electrically conductive structure forms an electrical connection between a second electrode structure, disposed on the electrically insulating layer, and the second electrically conductive trench structure.

* * * * *